United States Patent
Watanabe et al.

(10) Patent No.: US 8,628,908 B2
(45) Date of Patent: Jan. 14, 2014

(54) CHEMICALLY AMPLIFIED RESIST COMPOSITION AND PATTERNING PROCESS

(75) Inventors: Takeru Watanabe, Joetsu (JP); Tomohiro Kobayashi, Joetsu (JP); Masayoshi Sagehashi, Joetsu (JP); Takeshi Nagata, Joetsu (JP); Youichi Ohsawa, Joetsu (JP); Ryosuke Taniguchi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/406,684

(22) Filed: Feb. 28, 2012

(65) Prior Publication Data

US 2012/0225386 A1    Sep. 6, 2012

(30) Foreign Application Priority Data

Mar. 1, 2011 (JP) ................................ 2011-043556

(51) Int. Cl.
G03F 7/039 (2006.01)
G03F 7/20 (2006.01)
G03F 7/30 (2006.01)
G03F 7/38 (2006.01)

(52) U.S. Cl.
USPC ........ 430/270.1; 430/311; 430/326; 430/330; 430/907; 430/910; 430/921; 430/922; 430/925; 430/942

(58) Field of Classification Search
None
See application file for complete search history.

(56) References Cited

U.S. PATENT DOCUMENTS

| 6,749,988 | B2 | 6/2004 | Hatakeyama et al. | |
| 7,537,880 | B2 | 5/2009 | Harada et al. | |
| 7,771,914 | B2 | 8/2010 | Hatakeyama et al. | |
| 2008/0118860 | A1* | 5/2008 | Harada et al. | 430/270.1 |
| 2009/0274978 | A1 | 11/2009 | Ohashi et al. | |
| 2010/0028804 | A1* | 2/2010 | Iwato et al. | 430/270.1 |
| 2010/0266957 | A1 | 10/2010 | Harada et al. | |

FOREIGN PATENT DOCUMENTS

| JP | 2002-226470 A | 8/2002 |
| JP | 2002-363146 A | 12/2002 |
| JP | 2008-111103 A | 5/2008 |
| JP | 2008-122932 A | 5/2008 |
| JP | 2009-269953 A | 11/2009 |
| JP | 2010-250105 A | 11/2010 |
| JP | 2010-266857 A | 11/2010 |

OTHER PUBLICATIONS

JPO English abstract for JP2002-363146 provided by JPO (2002).*
Machine-assisted English translation of JP2002-363146, as provided by JPO (2002).*

* cited by examiner

*Primary Examiner* — Sin Lee
(74) *Attorney, Agent, or Firm* — Westerman, Hattori, Daniels & Adrian, LLP

(57) ABSTRACT

A chemically amplified resist composition is provided comprising (A) a specific tertiary amine compound, (B) a specific acid generator, (C) a base resin having an acidic functional group protected with an acid labile group, which is substantially insoluble in alkaline developer and turns soluble in alkaline developer upon deprotection of the acid labile group, and (D) an organic solvent. The resist composition has a high resolution, improved defect control in the immersion lithography, and good shelf stability.

8 Claims, No Drawings

CHEMICALLY AMPLIFIED RESIST COMPOSITION AND PATTERNING PROCESS

CROSS-REFERENCE TO RELATED APPLICATION

This non-provisional application claims priority under 35 U.S.C. §119(a) on Patent Application No. 2011-043556 filed in Japan on Mar. 1, 2011, the entire contents of which are hereby incorporated by reference.

TECHNICAL FIELD

This invention relates to a radiation-sensitive chemically amplified resist composition, and more particularly, to a chemically amplified positive resist composition suited for use in the photolithography with a variety of radiation including corpuscular beams such as DUV, typically KrF and ArF excimer laser, EUV, x-ray, synchrotron radiation, and EB, and a patterning process using the same.

BACKGROUND ART

While a number of recent efforts are being made to achieve a finer pattern rule in the drive for higher integration densities and operating speeds in LSI devices, the DUV lithography is studied as the advanced microfabrication technology. In particular, the photolithography using a KrF or ArF excimer laser as the energy source is developed and implemented as an essential technique capable of micropatterning to a feature size of 0.3 μm or less.

The chemically amplified resist materials for use in photolithography using light of an excimer laser, especially KrF excimer laser having a wavelength of 253 nm and ArF excimer laser having a wavelength of 193 nm, are required as a matter of course to have a high transmittance to light of the relevant wavelength. In addition, they are required to have an etch resistance sufficient to allow for film thickness reduction, a high sensitivity sufficient to eliminate any extra burden on the expensive optical material, and especially, a high resolution sufficient to form a fine pattern in a precise manner. A base resin having a high transparency, rigidity and reactivity must be developed before these requirements can be met. Active efforts were made to develop such resins, with some fruitful results. While studies are currently made on the ArF immersion, EUV and EB lithography processes to enable further miniaturization, the resin is required to have a higher resolution as well. In the advanced resist materials comprising many components of complex structure including a base resin, certain chemical reactions can take place during shelf storage due to interaction between components. Often the base resin, acid generator or surfactant will be decomposed, indicating a loss of shelf stability. It would thus be desirable to have a resist material which meets both high resolution and shelf stability for fine pattern formation and which is applicable to the immersion lithography without a need for protective film.

For the purpose of improving the resolution of a chemically amplified resist material to be processed by excimer laser photolithography, especially in the case of patterning to a ultrafine size of 0.1 μm or less, it is very important to control the diffusion of acid generated by an acid generator in the exposed area. In general, as the pattern size is reduced, the optimum acid diffusion rate is also reduced. For the advanced chemically amplified resist materials, it is a common practice to add an acid diffusion controlling agent, known as quencher, thereto for sensitivity adjustment, resolution enhancement or other purposes. Typically, amine compounds are used as the quencher. For optimum adjustment of the diffusion rate of generated acid, the structure of a quencher and a combination of the quencher with an acid generator anion species are crucial.

As the quencher having an excellent acid diffusion control function, Patent Document 1 proposes an amine compound having a morpholine structure and an oxygen functional group. A resist material comprising this amine compound has excellent resolution, but sometimes poor age stability. Compounds having aniline structure as described in Patent Documents 2 and 3 are known as the quencher providing relatively good shelf stability. Resist materials comprising these compounds still have insufficient resolution in micropatterning.

CITATION LIST

Patent Document 1: JP-A 2002-226470
Patent Document 2: JP-A 2010-266857
Patent Document 3: JP-A 2002-363146

SUMMARY OF INVENTION

An object of the invention is to provide a chemically amplified resist composition suited for use in the micropatterning lithography with a variety of radiation including corpuscular beams such as DUV, typically KrF and ArF excimer laser, EUV, x-ray, synchrotron radiation, and EB, which meets both high resolution for fine pattern formation and shelf stability and which is applicable to the immersion lithography without a need for protective film. Another object is provide a patterning process using the same.

In one aspect, the invention provides a chemically amplified resist composition comprising (A) at least one tertiary amine compound having the general formula (1), (B) at least one acid generator having the general formula (2), (C) a base resin having an acidic functional group protected with an acid labile group, which is insoluble or substantially insoluble in alkaline developer and turns soluble in alkaline developer upon deprotection of the acid labile group, and (D) an organic solvent.

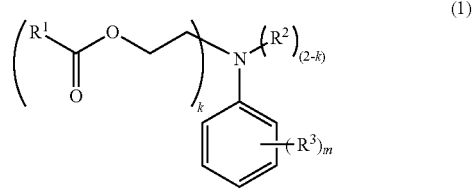

Herein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, k is 1 or 2, and m is an integer of 0 to 5.

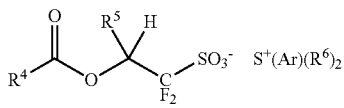

(2)

Herein $R^4$ is a $C_1$-$C_{30}$ alkyl, alkenyl or aralkyl group which may contain a heteroatom, or a backbone of the base resin (C), $R^5$ is hydrogen or trifluoromethyl, $R^6$ is Ar or a $C_1$-$C_{20}$ alkyl or alkenyl group which may contain a heteroatom, or two $R^6$ may bond together to form a $C_5$-$C_8$ ring with the sulfur atom to which they are attached, Ar is a substituted or unsubstituted $C_6$-$C_{20}$ aryl group which may contain a heteroatom.

In a preferred embodiment, the resist composition further comprises (E) a fluorinated polymer.

Preferably, the fluorinated polymer (E) is a polymer containing at least 15% by weight of fluorine which is partially decomposed under the action of alkaline developer to become more hydrophilic.

More preferably, component (E) comprises a polymer comprising at least 5% by weight of recurring units having the general formula (3) based on the entire recurring units.

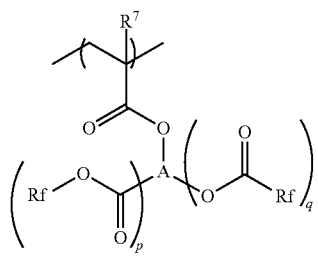

(3)

Herein $R^7$ is hydrogen or methyl, Rf is each independently a $C_1$-$C_{20}$ fluoroalkyl group, A is a $C_1$-$C_{30}$ organic group having a valence of (p+q+1), p and q are each independently an integer of 0 to 5, meeting p+q>0.

In a preferred embodiment, component (B) comprises at least one acid generator having the general formula (2a):

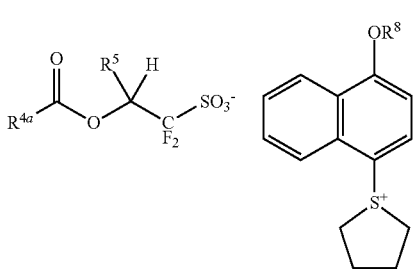

(2a)

wherein $R^{4a}$ is a $C_1$-$C_{30}$ alkyl, alkenyl or aralkyl group which may contain a heteroatom, $R^5$ is hydrogen or trifluoromethyl, and $R^8$ is hydrogen or a $C_1$-$C_{20}$ alkyl or alkenyl group which may contain a heteroatom.

In a preferred embodiment, component (A) comprises at least one tertiary amine compound having the general formula (1a):

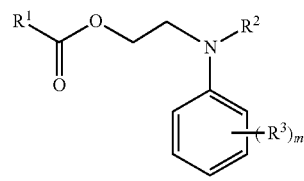

(1a)

wherein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, and m is an integer of 0 to 5.

The resist composition may further comprise (F) a surfactant.

The chemically amplified resist composition defined above has a high resolution sufficient to form a fine pattern and good shelf stability. It is advantageously used in micropatterning by photolithography.

In another aspect, the invention provides a pattern forming process comprising the steps of (1) coating the chemically amplified resist composition defined above onto a substrate and prebaking to form a resist film, (2) exposing the resist film patternwise to high-energy radiation having a wavelength of up to 300 nm or EB, and (3) baking and developing the exposed resist film with a developer.

The pattern forming process using the chemically amplified positive resist composition is successful in forming a fine size pattern of good profile and is advantageously used in micropatterning by photolithography.

ADVANTAGEOUS EFFECTS OF INVENTION

The chemically amplified resist composition has a high resolution and good shelf stability and is advantageously used in micropatterning by photolithography with EB, DUV and EUV. It is very useful as the KrF, ArF, EUV, EB, and x-ray resist materials, especially as the micropatterning material for the fabrication of VLSIs. It is applicable not only to the conventional lithography, but also to the immersion lithography, especially the immersion lithography without a protective film.

DESCRIPTION OF PREFERRED EMBODIMENTS

As used herein, the singular forms "a," an and the include plural referents unless the context clearly dictates otherwise.

"Optional" or "optionally" means that the subsequently described event or circumstances may or may not occur, and that description includes instances where the event or circumstance occurs and instances where it does not.

The notation ($C_n$-$C_m$) means a group containing from n to m carbon atoms per group.

The abbreviations and acronyms have the following meaning.

UV: ultraviolet
DUV: deep ultraviolet
EUV: extreme ultraviolet
EB: electron beam
Mw: weight average molecular weight
Mn: number average molecular weight
Mw/Mn: molecular weight distribution or dispersity
GPC: gel permeation chromatography
PEB: post-exposure baking
PAG: photoacid generator Making efforts to seek for the compound which is added to a chemically amplified resist composition to enhance resolution at no sacrifice of shelf stability, the inventors have found that when a tertiary amine compound having formula (1) or (1a) and an acid generator having formula (2) or (2a) are compounded in combination, a chemically amplified resist composition which has both a high resolution and good shelf stability is obtained.

Tertiary Amine Compound

In the chemically amplified resist composition of the invention, one or more tertiary amine compounds are compounded as the quencher. The tertiary amine compounds are aniline compounds having the general formula (1) or (1a).

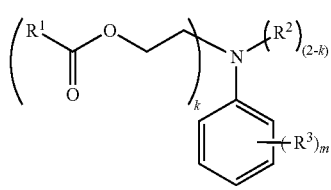
(1)

Herein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, k is 1 or 2, and m is an integer of 0 to 5.

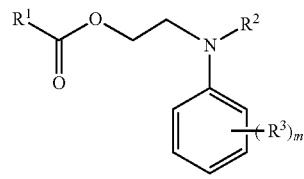
(1a)

Herein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, and m is an integer of 0 to 5.

In formulae (1) and (1a), $R^1$ is a $C_1$-$C_{20}$ alkyl or alkenyl group or a substituted or unsubstituted $C_6$-$C_{20}$ aryl or aralkyl group, which may contain a heteroatom. Exemplary heteroatoms include oxygen, nitrogen, sulfur and halogen atoms, with oxygen being preferred. The alkyl group may be straight, branched or cyclic while it is preferred for forming a pattern of good profile that the alkyl group have 1 to 20 carbon atoms. Suitable groups of $R^1$ include, but are not limited to, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, trifluoroethyl, (2-methoxyethoxy)methyl, acetoxymethyl, phenyl, naphthyl, tolyl, xylyl, trimethylphenyl, methoxyphenyl, methylthiophenyl, and acetamidophenyl.

In formulae (1) and (1a), $R^2$ is a $C_1$-$C_{10}$ alkyl group. Examples include, but are not limited to, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, and decyl. Inter alia, methyl and ethyl are preferred as $R^2$.

In formulae (1) and (1a), $R^3$ is a $C_1$-$C_{10}$ alkyl group or $C_1$-$C_{10}$ alkoxy group. Examples include, but are not limited to, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, decyl, methoxy, ethoxy, propoxy, isopropoxy, butoxy, t-butoxy, hexyloxy, cyclohexyloxy, and decyloxy. Inter alia, methyl, ethyl, t-butyl, and methoxy are preferred as $R^3$.

In formula (1), k is 1 or 2. A compound of formula (1) wherein k=1 is preferred since it provides a resist composition with a good balance of properties. In formulae (1) and (1a), m is an integer of 0 to 5, preferably 0 or 1, and most preferably m=0.

Illustrative non-limiting examples of the tertiary amine compounds having formulae (1) and (1a) are given below.

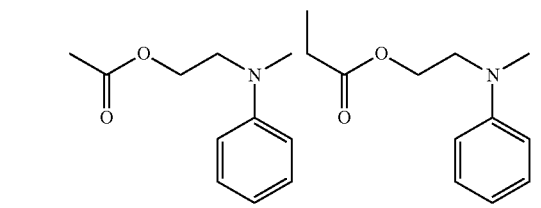

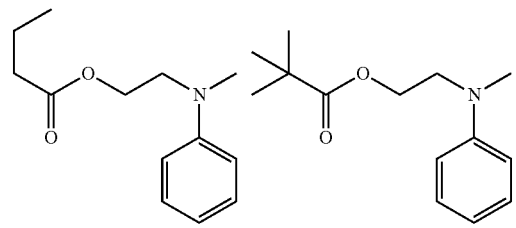

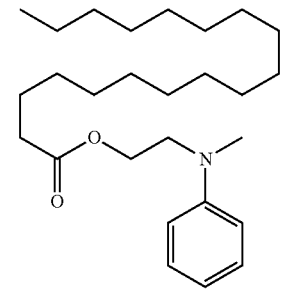

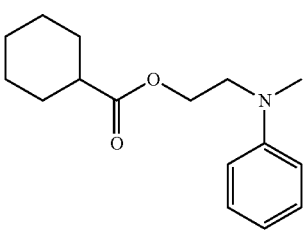

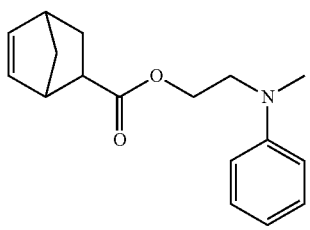

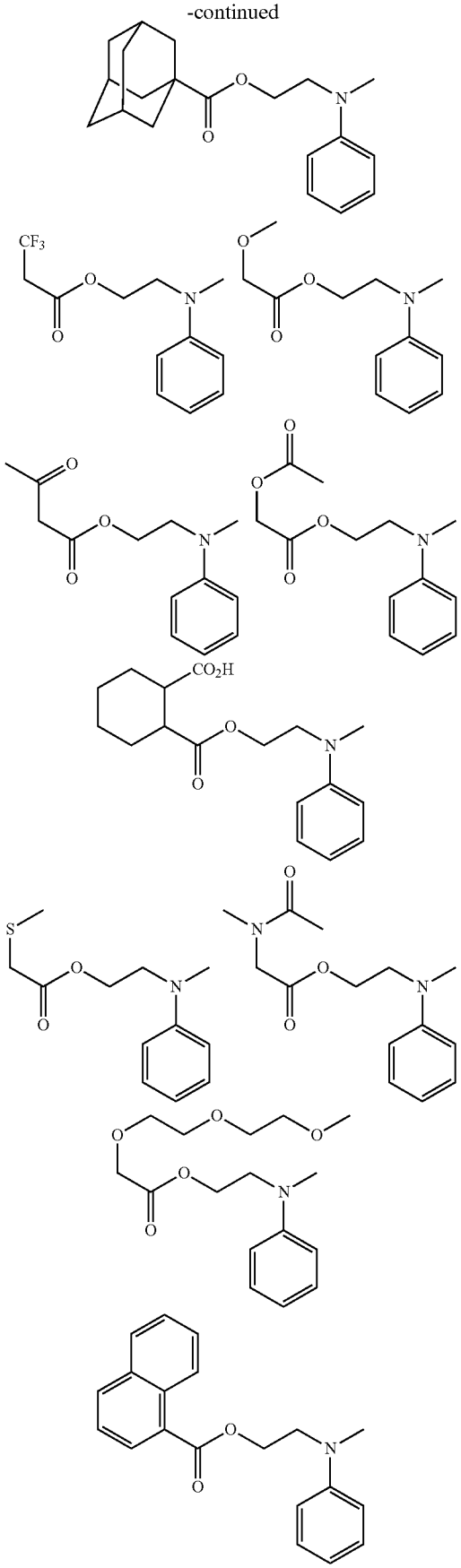
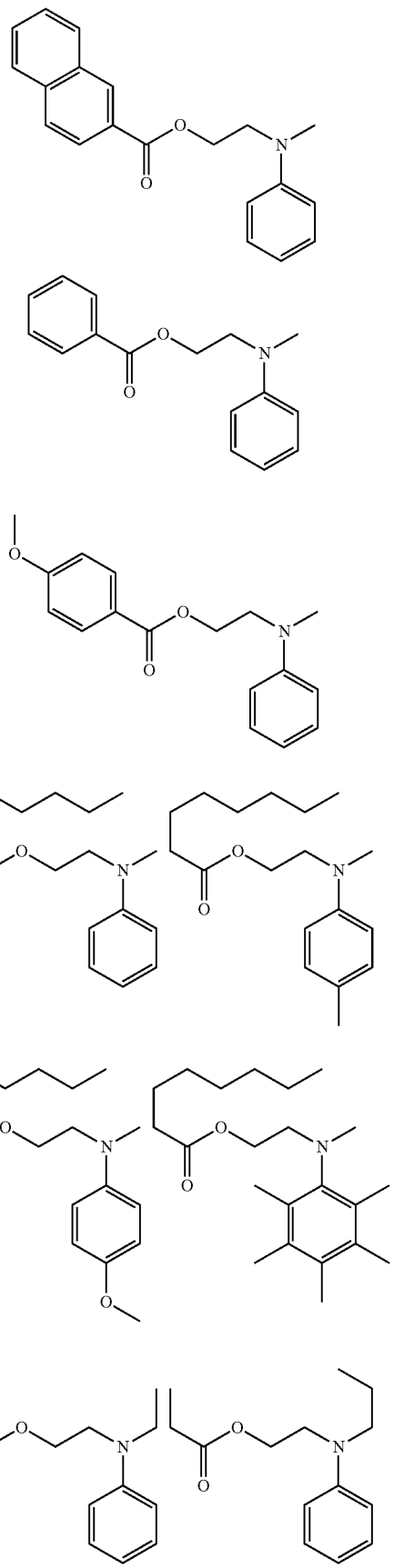

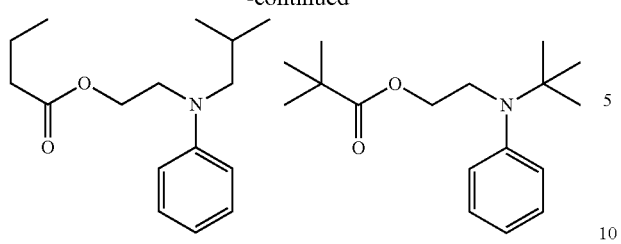
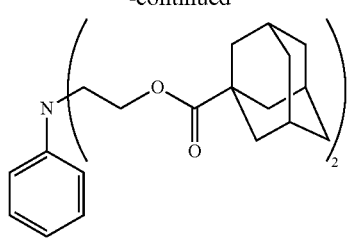
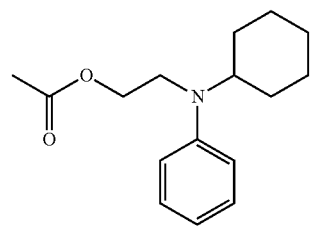
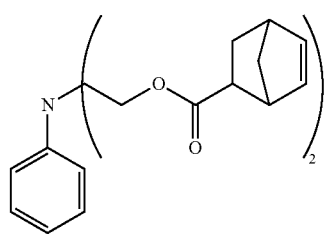
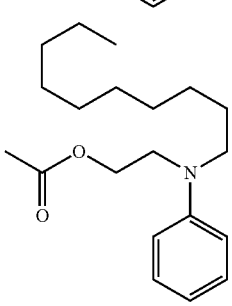
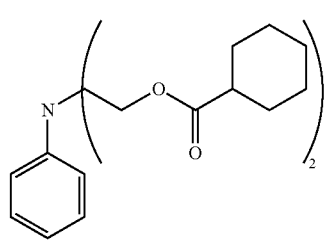
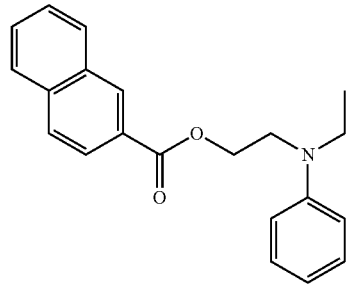
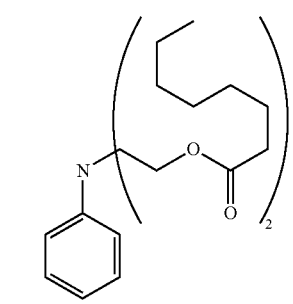
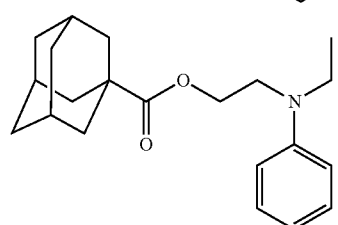
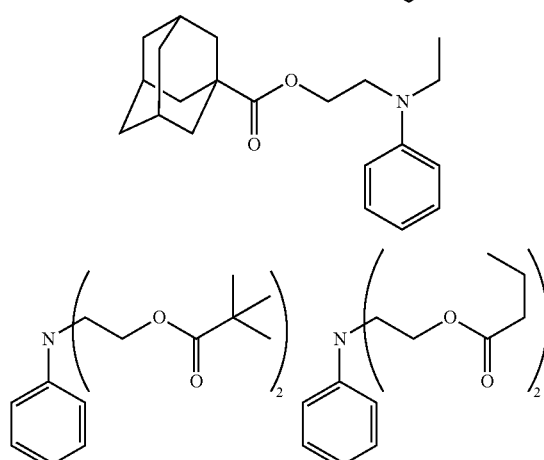
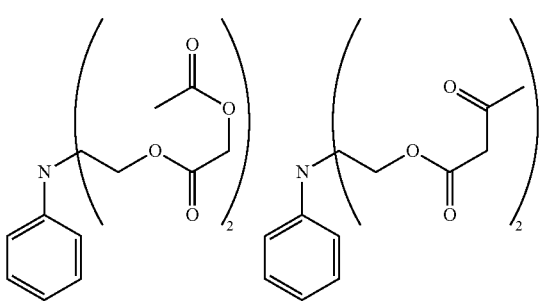
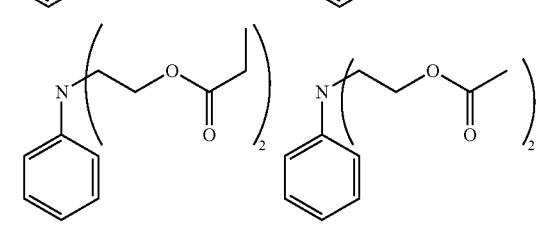
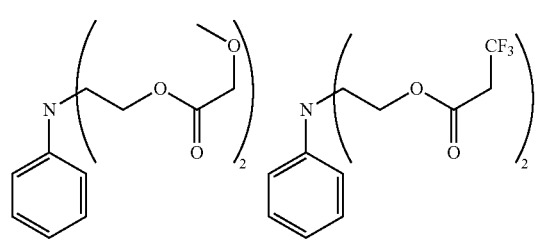

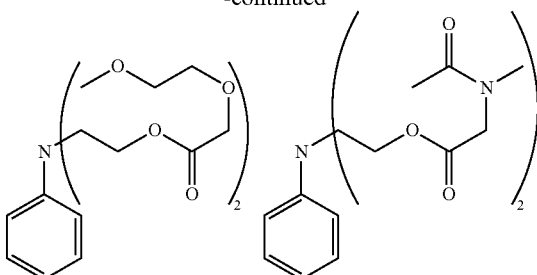
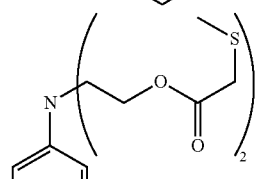
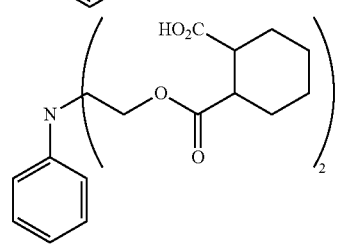
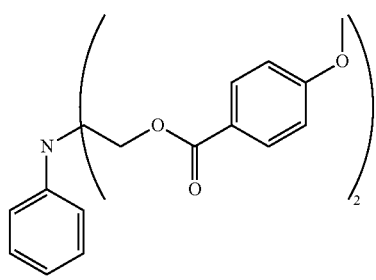
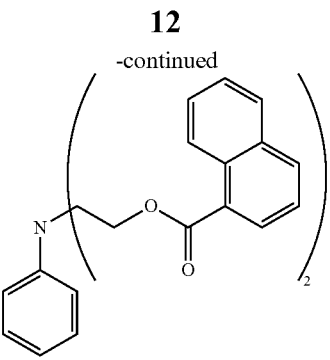
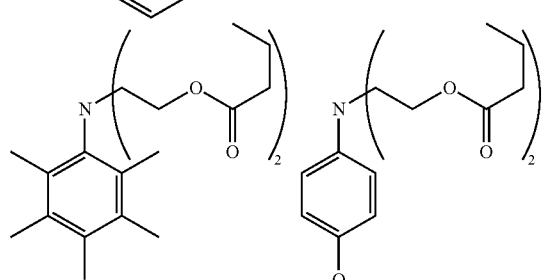
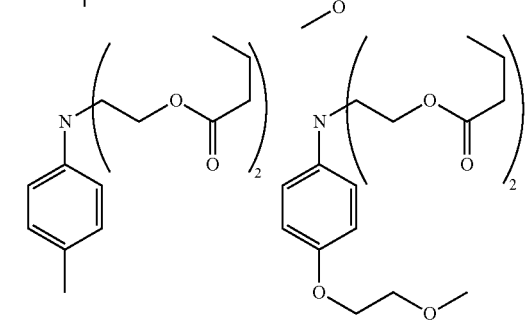

The tertiary amine compounds having formulae (1) and (1a) used as the quencher have an amine nucleus of aniline structure. Anilines are generally weak bases having a dissociation constant pKa of conjugate acid which is up to 7, and are less basic than common amine compounds. Because of the tertiary structure, the tertiary amine compounds have very low nucleophilic reactivity, as compared with primary and secondary amine compounds having high reactivity. Since the acyloxy group ($R^1COO$—) as 2-position side chain is electron attractive, the tertiary amine compounds have lower basicity and nucleophilic reactivity, with a least likelihood of decomposition reaction of another resist component by the basicity and nucleophilic reactivity of amine. That is, the detrimental impact of amine compounds on shelf stability is minimized. Also, since the carbonyl moiety in the acyloxy group ($R^1COO$—) as 2-position side chain has a high affinity (as viewed from the theory of rate) to the acid generated by the acid generator, the carbonyl moiety may quickly capture the generated acid around there and deliver it to the nearby amine center. In this way, the carbonyl moiety effectively suppresses the rate of acid diffusion, contributing to a high resolution. A proper choice of $R^1$, $R^2$, $R^3$, k and m in formula (1) or (1a) from their lists of alternatives makes it possible to tailor the diffusion rate, acid diffusion suppressing ability, volatility, polarity, hydrophilicity, basicity, and nucleophilic reactivity of a tertiary amine compound, in accordance with a particular base resin, acid generator and exposure method used, and eventually to tailor the pattern profile and performance characteristics of a resist composition optimum.

The tertiary amine compounds having formula (1) or (1a) may be used alone or in admixture of two or more. If desired, the tertiary amine compound may be used in combination with another known quencher. The other known quencher which can be used in combination is not particularly limited and may be selected from the basic compounds or nitrogen-containing organic compounds described in U.S. Pat. No. 7,537,880 (JP-A 2008-111103, paragraphs [0146] to [0163]).

In the resist composition, the tertiary amine compound having formula (1) or (1a) is preferably used in an amount of 0.01 to 20 parts, more preferably 0.1 to 10 parts by weight per 100 parts by weight of the base resin (C). Less than 0.01 pbw of the tertiary amine compound may fail to achieve the addition effect whereas more than 20 pbw may lead to a lowering of sensitivity.

As mentioned above, the tertiary amine compound having formula (1) or (1a) has favorable properties as the quencher. However, when the tertiary amine compound having formula (1) or (1a) is used in combination with a common acid generator, there is a tendency that the resist pattern has insufficient resolution and degraded profile. The reason is explained to be that the tertiary amine compound having formula (1) or (1a), due to its low basicity as pointed out above, is relatively difficult to completely capture the generated acid. This tendency becomes outstanding particularly when the acid generated by the acid generator is a non-superstrong acid such as p-toluenesulfonic acid or camphorsulfonic acid, or a volatile acid such as trifluoromethanesulfonic acid or nonafluorobutanesulfonic acid, as commonly used in the art. Through extensive investigations, the inventors have found that both a sufficient resolution to form a fine size pattern and shelf stability are met by selecting the acid generator to be combined with the tertiary amine compound having formula (1) or (1a) from the acid generators having formula (2) or (2a).

Acid Generator

In the chemically amplified resist composition, one or more acid generators having the general formula (2) or (2a) are compounded.

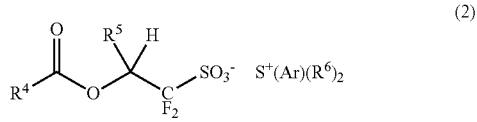

(2)

Herein $R^4$ is a $C_1$-$C_{30}$ alkyl, alkenyl or aralkyl group which may contain a heteroatom, or a backbone of the base resin (C), $R^5$ is hydrogen or trifluoromethyl, $R^6$ is Ar or a $C_1$-$C_{20}$ alkyl or alkenyl group which may contain a heteroatom, or two $R^6$ may bond together to form a $C_5$-$C_8$ ring with the sulfur atom to which they are attached, Ar is a substituted or unsubstituted $C_6$-$C_{20}$ aryl group which may contain a heteroatom.

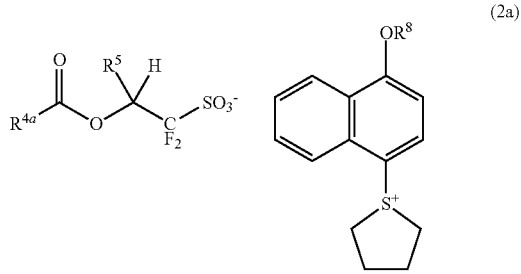

(2a)

Herein $R^{4a}$ is a $C_1$-$C_{30}$ alkyl, alkenyl or aralkyl group which may contain a heteroatom, $R^5$ is hydrogen or trifluoromethyl, and $R^8$ is hydrogen or a $C_1$-$C_{20}$ alkyl or alkenyl group which may contain a heteroatom.

In formula (2), $R^4$ is a $C_1$-$C_{30}$ alkyl, alkenyl or aralkyl group which may contain a heteroatom, or a backbone of the base resin (C). In formula (2a), $R^{4a}$ is a $C_1$-$C_{30}$ alkyl, alkenyl or aralkyl group which may contain a heteroatom. Suitable heteroatoms contained in $R^4$ and $R^{4a}$ include oxygen, nitrogen, sulfur and halogen atoms, with oxygen being preferred. The $C_1$-$C_{30}$ alkyl, alkenyl or aralkyl group of $R^4$ and $R^{4a}$ may be straight, branched or cyclic while it is preferred for achieving a high resolution sufficient to form a fine size pattern that these groups have 6 to 30 carbon atoms. It is undesirable that $R^4$ or $R^{4a}$ be aryl because the resulting resist pattern may have less smooth sidewalls. Exemplary groups of $R^4$ and $R^{4a}$ include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl. When $R^4$ is a backbone of the base resin (C), it is recommended that a monomer containing $R^4$ which is vinyl or isopropenyl be copolymerized during preparation of the base resin whereby the acid generator is incorporated in the base resin.

In formula (2) or (2a), $R^5$ is hydrogen or trifluoromethyl. It is preferred that $R^5$ be trifluoromethyl because the acid generator of formula (2) or (2a) is more soluble in solvents.

In formula (2), Ar is a substituted or unsubstituted $C_6$-$C_{20}$ aryl group which may contain a heteroatom. Suitable heteroatoms contained in Ar include oxygen, nitrogen, sulfur and halogen atoms, with oxygen and fluorine being preferred. Suitable groups of Ar include, but are not limited to, phenyl, naphthyl, anthryl, phenanthryl, pyrenyl, tolyl, xylyl, trimethylphenyl, ethylphenyl, biphenylyl, methoxyphenyl, fluorophenyl, difluorophenyl, t-butylphenyl, ethoxyphenyl, butoxyphenyl, t-butoxyphenyl, methylthiophenyl, trifluorophenylmethyl, acetoxyphenyl, hydroxyphenyl, dimethylaminophenyl, methylnaphthyl, hydroxynaphthyl, dihydroxynaphthyl, methoxynaphthyl, butoxynaphthyl, 2,2,2-trifluoroethoxynaphthyl, and (2-methoxyethoxy)naphthyl.

In formula (2), $R^6$ is Ar or a $C_1$-$C_{20}$ alkyl or alkenyl group which may contain a heteroatom. Alternatively, two $R^6$ bond together to form a $C_5$-$C_8$ ring with the sulfur atom to which they are attached at their opposite ends. Suitable heteroatoms contained in $R^6$ include oxygen, nitrogen, sulfur and halogen atoms, with oxygen and fluorine being preferred. Alkyl groups of $R^6$ may be straight, branched or cyclic. Examples of the optionally heteroatom-containing $C_1$-$C_{20}$ alkyl or alkenyl group of $R^6$ include, but are not limited to, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosyl, allyl, tetrahydrofurfuryl, methoxyethyl, ethoxyethyl, trifluoromethyl, trifluoroethyl, and methylthioethyl. When two $R^6$ bond together to form a $C_5$-$C_8$ ring with the sulfur atom to which they are attached, exemplary ring structures include, but are not limited to, thiophene, tetrahydrothiophene, benzothiophene, dibenzothiophene, thiopyran, dibenzothiine, thiane, thiepine, thiepane, thiocine, thiocane, oxathiine, phenoxathiine, thianthrene, and dithiane.

In formula (2a), $R^8$ is hydrogen or a $C_1$-$C_{20}$ alkyl or alkenyl group which may contain a heteroatom. Suitable heteroatoms contained in $R^8$ include oxygen, nitrogen, sulfur and halogen atoms, with oxygen and fluorine being preferred. Alkyl or alkenyl groups of $R^8$ may be straight, branched or cyclic. Examples of $R^8$ include, but are not limited to, hydrogen, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosyl, allyl, tetrahydrofurfuryl, 2-methoxyethyl, 2-ethoxyethyl, trifluoromethyl, trifluoroethyl, methylthioethyl, methoxyethyl, and 2-(2-methoxyethoxy)ethyl.

Illustrative non-limiting examples of the acid generators having formulae (2) and (2a) are given below. Herein Ph stands for phenyl and Ac for acetyl.

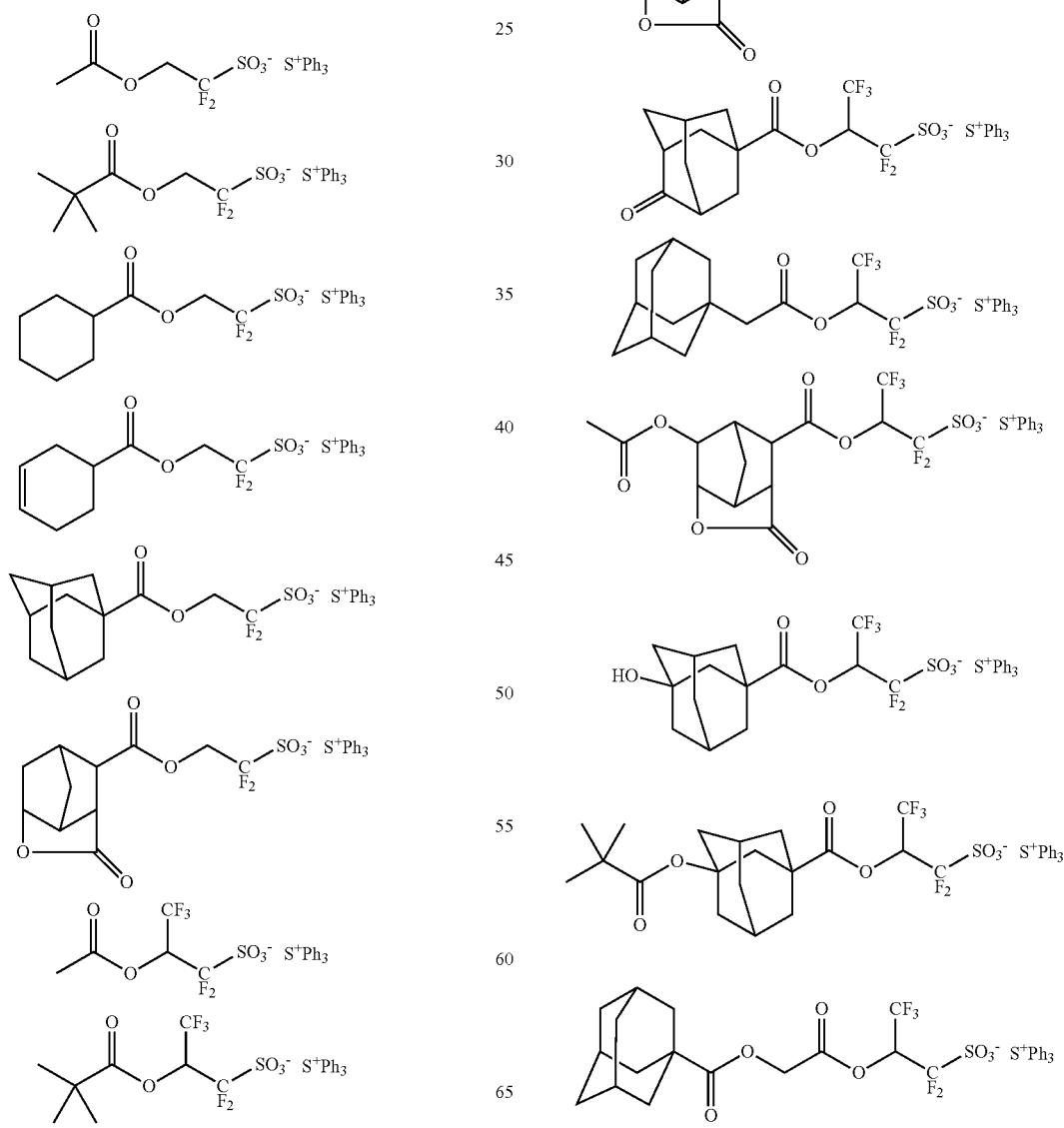

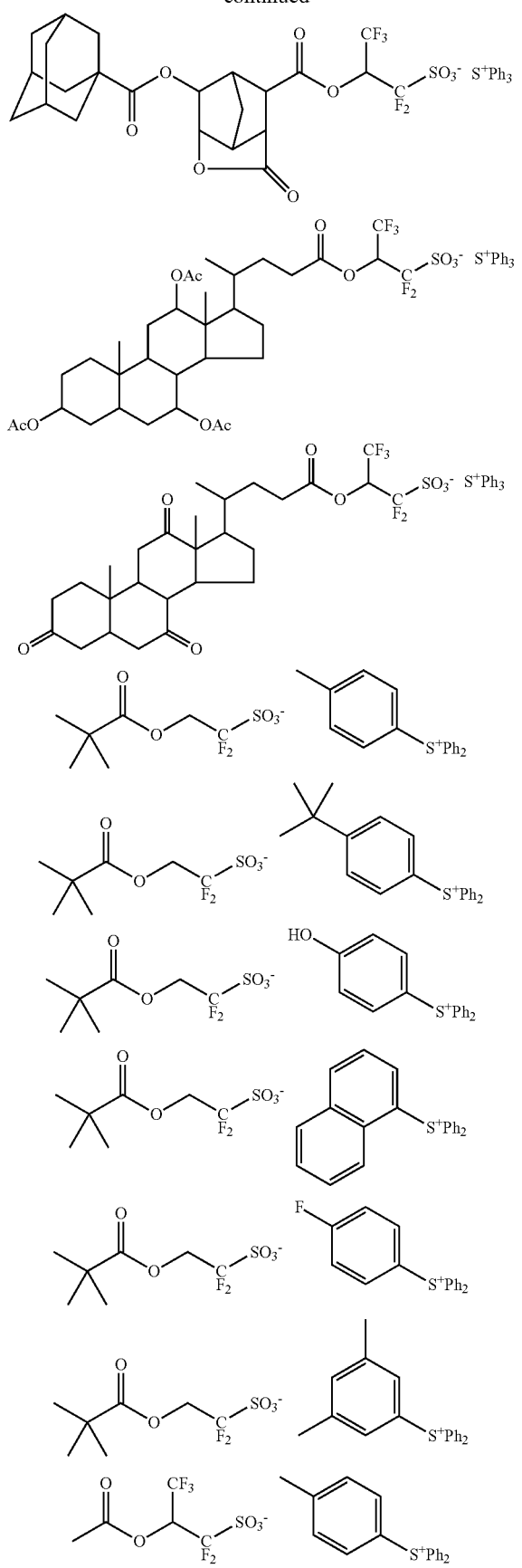
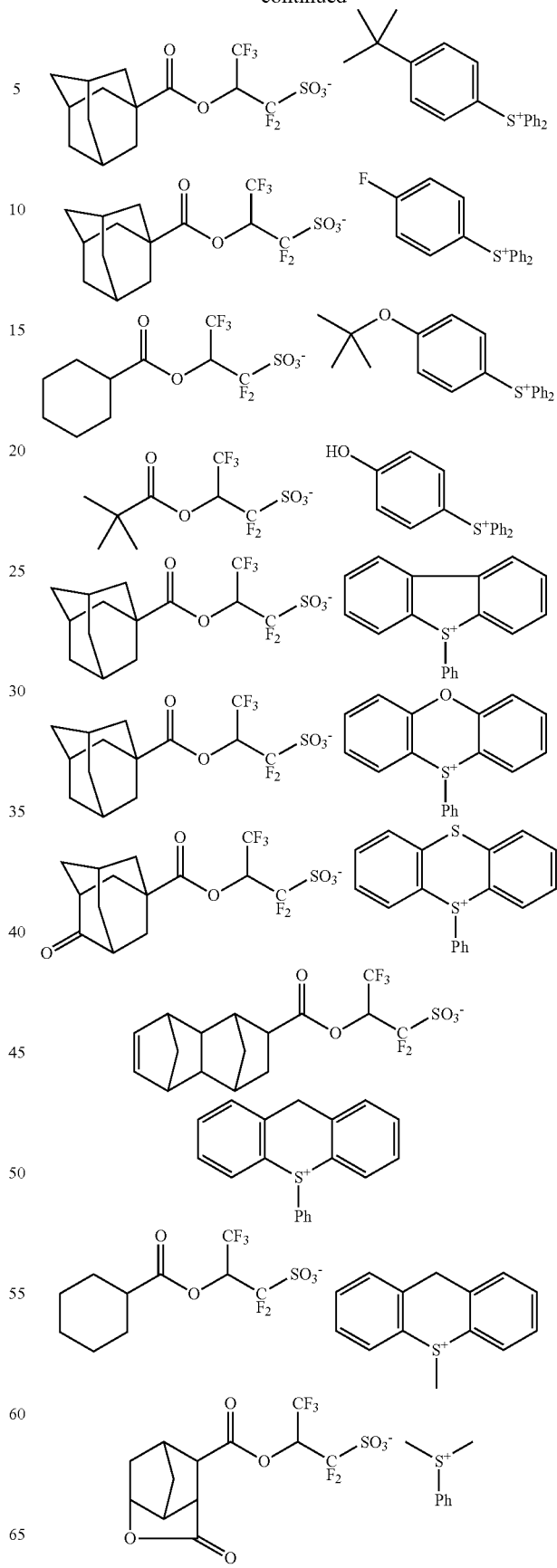

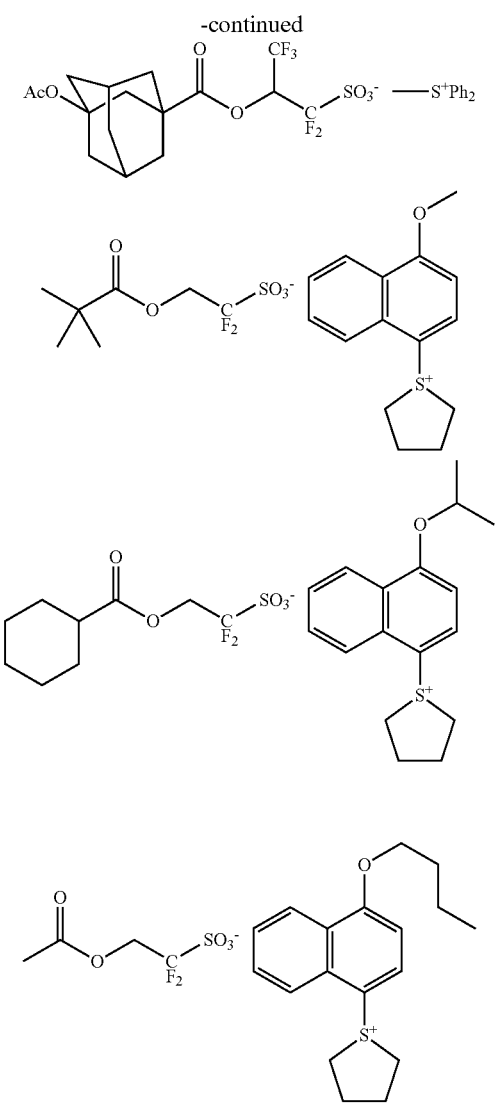
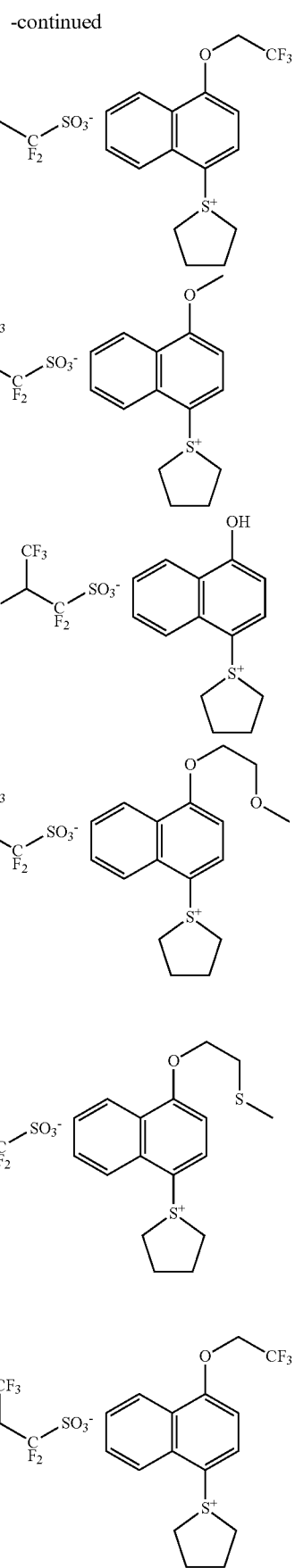

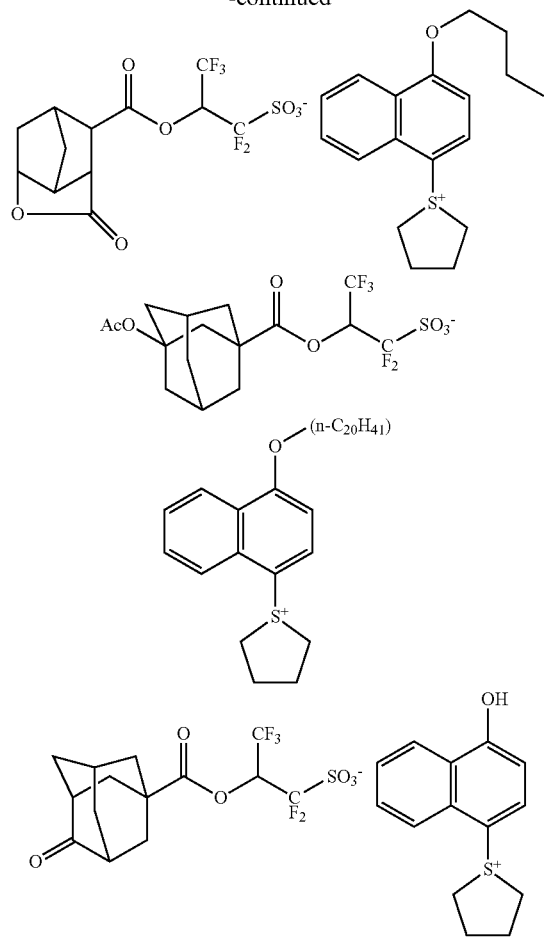

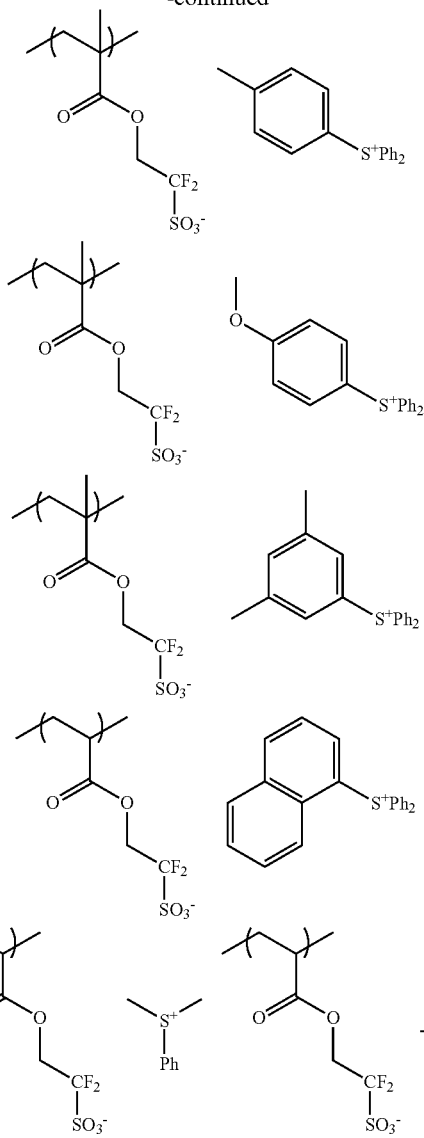

The acid generator having formula (2) wherein $R^4$ is a backbone of the base resin (C) means that recurring units corresponding to formula (2) are incorporated in the base resin to be described later. Since the acid generated by the acid generator is bound to the polymer, significant control of acid diffusion is possible. This embodiment is advantageous when it is intended to form a fine pattern with a pitch equal to or less than 80 nm. The recurring units corresponding to formula (2) are exemplified by the following units, but not limited thereto.

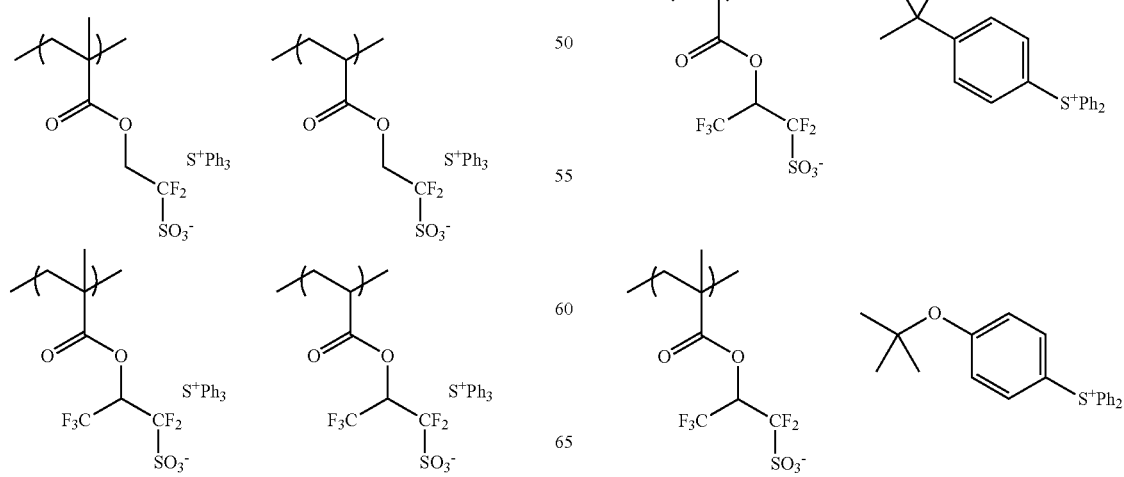

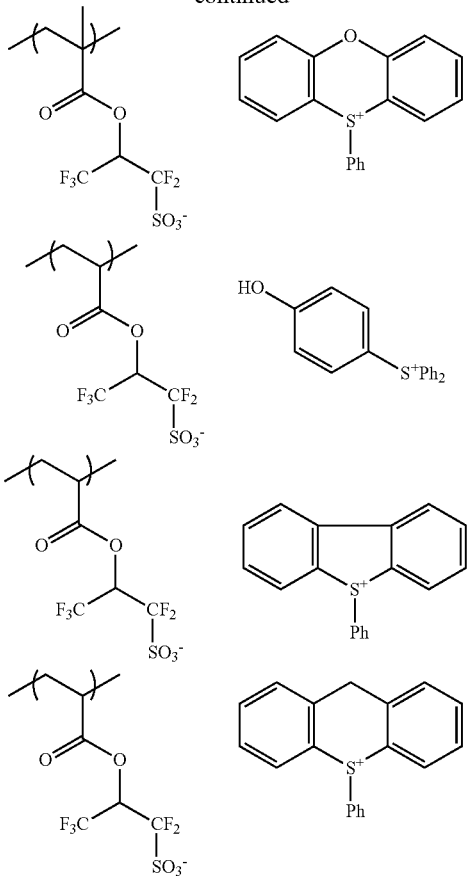

When the recurring units corresponding to formula (2) are incorporated in the base resin, the content of recurring units corresponding to formula (2) is preferably 0.2 to 20 mol %, more preferably 0.5 to 15 mol % based on the entire recurring units of the resin. Outside the range, a lower content may fail to achieve the effect of incorporation whereas a resin with a higher content may lose solvent solubility and cause more coating defects.

In the acid generator having formula (2) or (2a) which is compounded in the resist composition, a difluoromethylene radical is at α-position of the anionic sulfonate group. Thus the acid generated by this acid generator is a superstrong acid equivalent to trifluoromethanesulfonic acid or the like, which allows the base resin in the exposed area to undergo decomposition reaction to a full extent, affording a high dissolution contrast. In addition, the presence of an acyloxy group in the anion moiety increases polarity and molecular weight, and controls the volatility and diffusion rate of the generated acid, eventually contributing to an improvement in the resolution of a fine pattern. Inter alia, the acid generators having formula (2a) are preferred since they have a transmittance and an efficiency of acid generation such that a resist pattern of rectangular profile with minimized footing may be formed. A proper choice of $R^4$, $R^{4a}$, $R^5$, $R^6$, $R^8$ and Ar in formula (2) or (2a) from their lists of alternatives makes it possible to tailor the transmittance, acid generation efficiency, solvent solubility, polarity, hydrophilicity, in-film distribution, and stability of an acid generator as well as the acidity, diffusion rate, volatility and base resin affinity of the generated acid, in accordance with a particular base resin and exposure method used, and eventually to tailor the resolution and performance characteristics of a resist composition optimum.

The acid generators having formula (2) or (2a) may be used alone or in admixture of two or more. It is possible to control the transmittance of a resist film by selecting an acid generator having a low transmittance at the exposure wavelength and adjusting the amount of the acid generator added. If desired, the acid generator having formula (2) or (2a) may be used in combination with another known acid generator. The other known acid generator which can be used in combination is not particularly limited and may be selected from the compounds described in U.S. Pat. No. 7,537,880 (JP-A 2008-111103, paragraphs [0122] to [0142]).

It is noted that an acid diffusion controlling function may be provided when two or more acid generators are used in admixture provided that one acid generator is an onium salt capable of generating a weak acid. Specifically, in a system using a mixture of a PAG capable of generating a strong acid (e.g., fluorinated sulfonic acid) and an onium salt capable of generating a weak acid (e.g., non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

If the acid generator capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

The amount of the acid generator having formula (2) or (2a) added to the resist composition is not particularly limited as long as the objects of the invention are not compromised. Preferably, the acid generator having formula (2) or (2a) is used in an amount of 0.1 to 80 parts, more preferably 1 to 40 parts by weight per 100 parts by weight of the base resin (C). Too high a proportion of the acid generator may give rise to problems such as degraded resolution and foreign particles during development and resist film stripping.

The compound having formula (2) or (2a) has favorable properties as the acid generator to be used in resist materials. However, when the acid generator having formula (2) or (2a) is used in combination with a common quencher, the resist composition may have insufficient resolution or poor shelf stability. In particular, the acid generator having formula (2a) tends to give rise to a problem of shelf stability because the tetrahydrothiophene ring within its molecule is susceptible to nucleophilic attack by an amine compound or the like. Through extensive investigations, the inventors have found that both a sufficient resolution to form a fine size pattern and shelf stability are met by selecting the quencher to be combined with the acid generator from the quenchers having formula (1) or (1a).

Fluorinated Polymer

As the advanced photolithography using excimer laser radiation as the energy source, the immersion lithography of holding water between the lens and the resist film during exposure has started commercial application. In the water immersion lithography, it is essential to prevent formation of defects owing to penetration of immersion water into the resist film and contamination of the lens with resist components leached out in immersion water. In the prior art immersion lithography process, it is a common practice to apply a separate protective film on the resist film prior to immersion exposure. For saving the cost of coating a separate resist protective film, efforts are made to develop a technique of compounding a special polymer (referred to as "polymeric additive" for the immersion lithography) in the resist composition. When compounded in the resist composition, the polymeric additive segregates at the surface of a resist film as spin coated to exert a barrier effect equivalent to a protective film, and functions to prevent or reduce penetration of water into the resist film or to prevent leaching from the resist film during exposure in water. The polymeric additive is required not only to have surface segregation, but also to impart high water repellency and water slip to the film surface to prevent water from remaining on the resist film after the immersion exposure. In this context, the resist composition of the invention may optionally comprise (E) a fluorinated polymer as the polymeric additive for the immersion lithography. To meet the desired surface segregation, water repellency and water slip, the fluorinated polymer should preferably contain at least 15% by weight, more preferably at least 25% by weight of fluorine. On the other hand, when the polymeric additive is compounded, the resist film surface becomes less hydrophilic due to the effect of the additive, with an increased likelihood of forming development defects, known as blob defects, during the resist development step, probably owing to deposition of resist components on the unexposed area. To prevent blob defects and to ensure the barrier effect, the fluorinated polymer (E) is preferably a polymer containing at least 15% by weight of fluorine which is partially decomposed under the action of alkaline developer to become more hydrophilic. Use of such a polymer as the polymeric additive for the immersion lithography solves the problem associated with the water immersion exposure step because the additive segregates at the surface of a resist film during film formation, providing high water repellency and water slip. At the same time, the problem associated with the development step is solved because the surface segregated additive is partially decomposed to increase hydrophilicity, preventing formation of blob defects.

In a more preferred embodiment, the fluorinated polymer as optional component (E) is a polymer comprising at least 5% by weight of recurring units having the general formula (3):

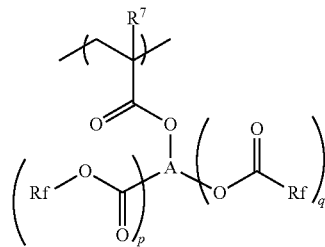

(3)

wherein $R^7$ is hydrogen or methyl, Rf is each independently a $C_1$-$C_{20}$ fluoroalkyl group, A is a $C_1$-$C_{30}$ organic group having a valence of (p+q+1), p and q are each independently an integer of 0 to 5, meeting p+q>0.

In formula (3), $R^7$ is hydrogen or methyl. Rf is each independently a $C_1$-$C_{20}$ fluoroalkyl group. As used herein, the term "fluoroalkyl" group refers to an alkyl group in which some or all hydrogen atoms are replaced by fluorine atoms. The fluoroalkyl group of Rf may be straight, branched or cyclic. Exemplary fluoroalkyl groups include, but are not limited to, fluoromethyl, difluoromethyl, trifluoromethyl, fluoroethyl, difluoroethyl, trifluoroethyl, perfluoroethyl, trifluoropropyl, tetrafluoropropyl, pentafluoropropyl, perfluoropropyl, trifluoroisopropyl, hexafluoroisopropyl, perfluoroisopropyl, pentafluorobutyl, hexafluorobutyl, heptafluorobutyl, perfluorobutyl, heptafluoropentyl, octafluoropentyl, nonafluoropentyl, perfluoropentyl, nonafluorohexyl, decafluorohexyl, dodecafluorohexyl, perfluorohexyl, heptadecafluorodecyl, octadecafluorodecyl, perfluorocyclohexyl, trifluoro-t-butyl, hexafluoro-t-butyl, nonafluoro-t-butyl, perfluoroadamantyl, and perfluoroeicosyl.

In formula (3), p and q are each independently an integer of 0 to 5, preferably 0 to 3, meeting p+q>0, that is, not both p and q are zero at the same time. Preferably, the sum of p and q is 1 to 5, more preferably 1 to 3. A is a $C_1$-$C_{30}$ organic group having a valence of (p+q+1). Organic groups of A may be straight, branched or cyclic and contain a heteroatom such as oxygen, halogen, nitrogen or sulfur. The heteroatom, when contained, is most preferably oxygen and the organic group may have an oxygen functional group such as an ether, ester or acetal group. A is a (p+q+1)-valent $C_1$-$C_{30}$ organic group which is derived by eliminating a number (p+q) of hydrogen atoms from a straight, branched or cyclic, monovalent $C_1$-$C_{30}$ organic group which may contain a heteroatom. Examples of the monovalent $C_1$-$C_{30}$ organic group include, but are not limited to, methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofuryl, methoxymethyl, ethoxymethyl, trifluoroethyl, (2-methoxyethoxy)methyl, acetoxymethyl, phenyl, naphthyl, tolyl, xylyl, trimethylphenyl, methoxyphenyl, methylthiophenyl, acetamidophenyl, 7-oxanorbornyl, acetoxymethyl, acetoxyethyl, acetoxypropyl, acetoxybutyl, methoxycarbonylmethyl, methoxycarbonylether, methoxycarbonylpropyl, methoxycarbonylbutyl, methoxycarbonylcyclohexyl, and methoxycarbonyladamantyl.

Illustrative non-limiting examples of the recurring unit having formula (3) are given below. Herein $R^7$ stands for hydrogen or methyl.

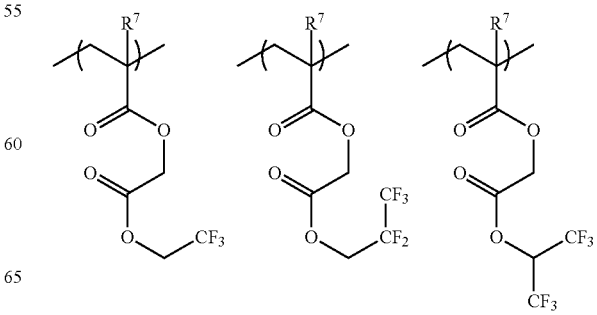

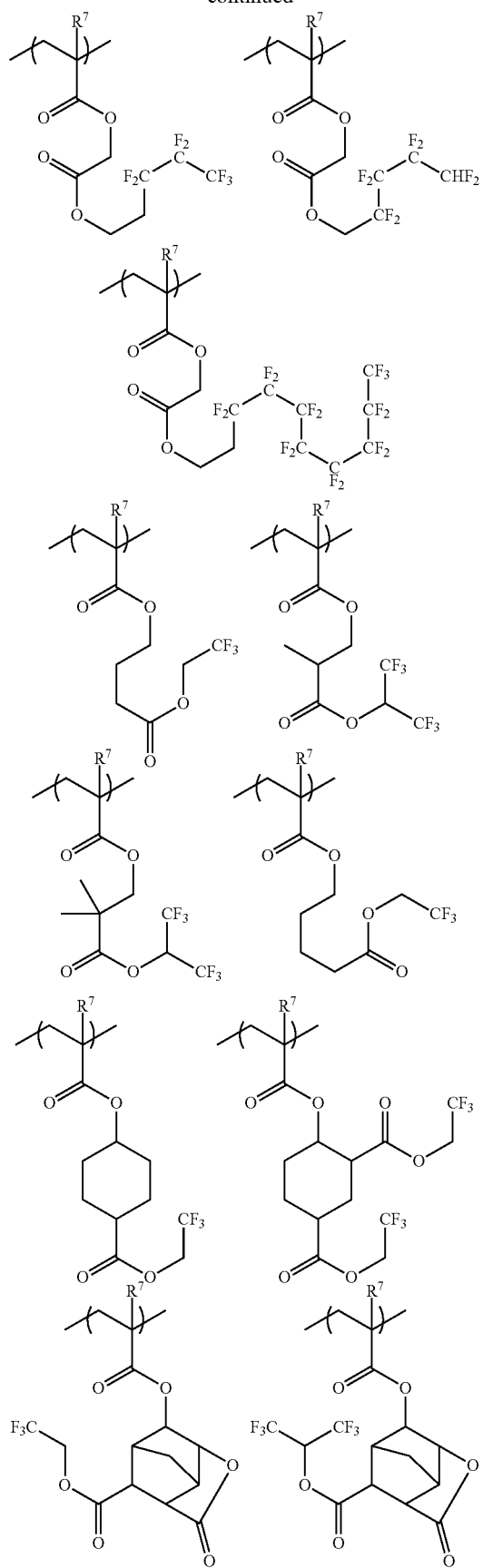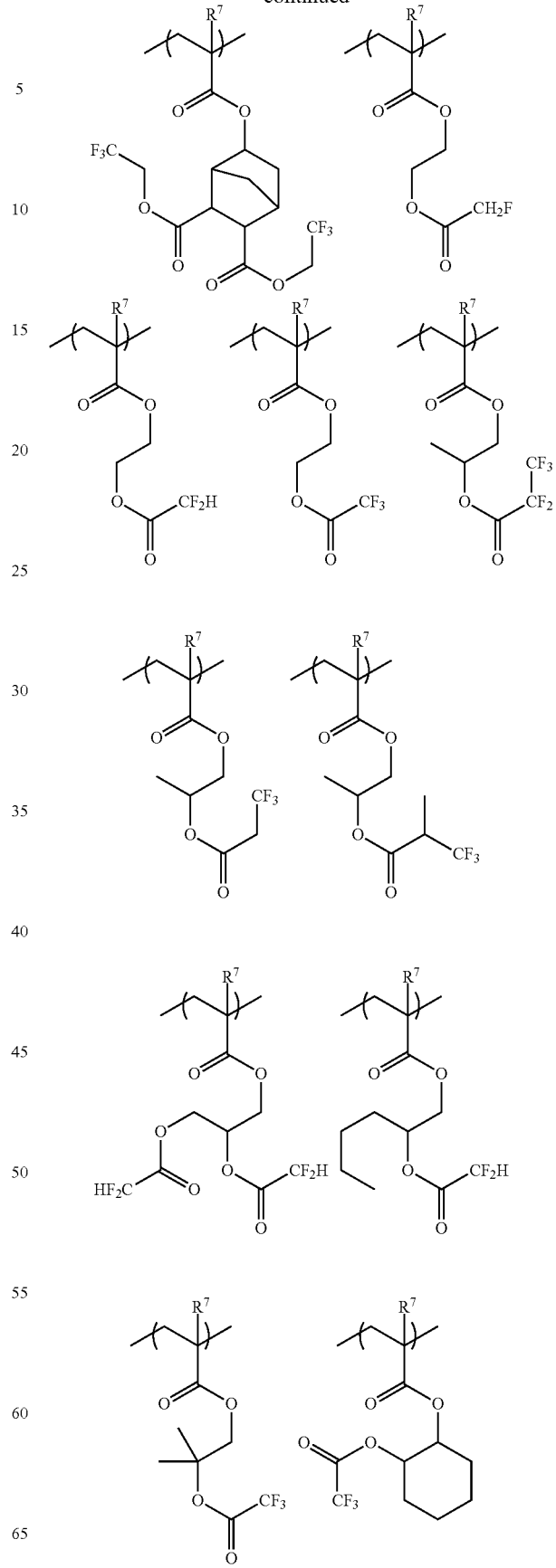

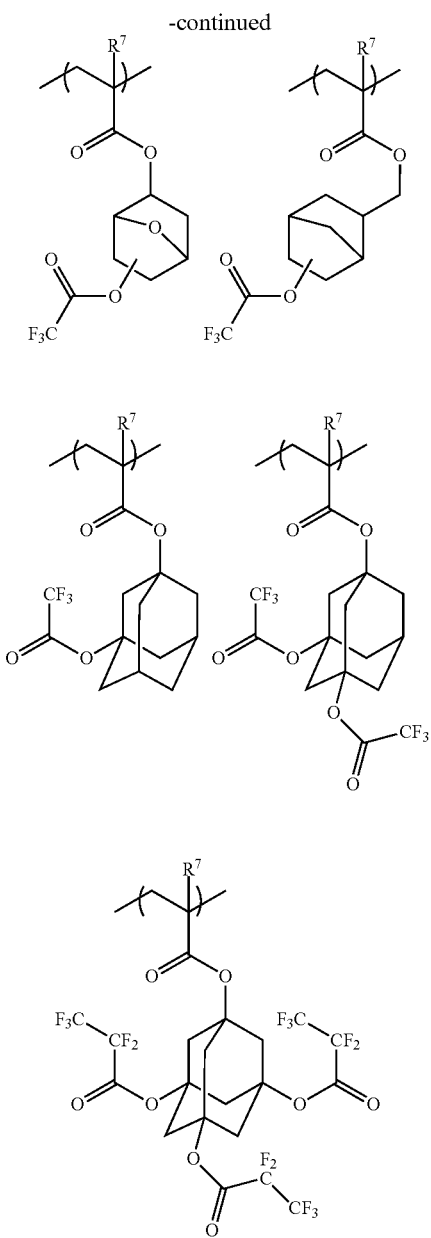

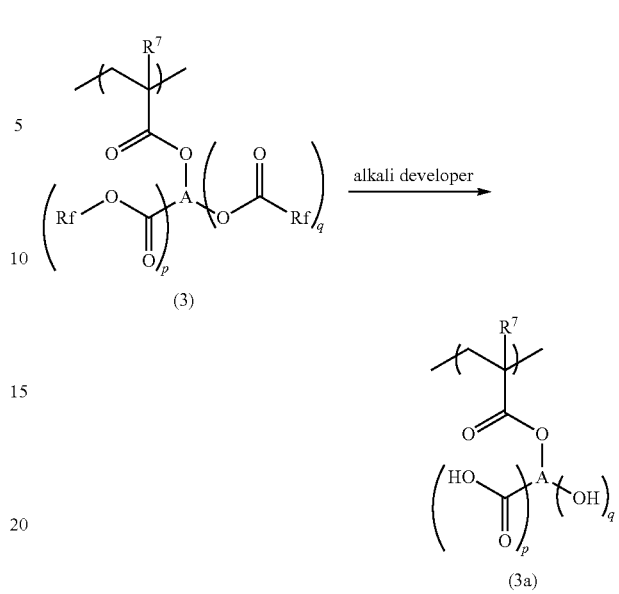

The recurring unit having formula (3) contains fluorine and contributes to improvements in surface segregation and water repellency of a polymer comprising the same. Also the recurring unit having formula (3) has an ester structure of —C(O)ORf or —OC(O)Rf which is highly water repellent. Because of the reduced electron density of carbonyl carbon under the influence of the electron attraction of fluorine atoms in Rf, this ester structure is significantly susceptible to alkaline hydrolysis as compared with ordinary esters. In addition, since this ester structure is spaced apart from the backbone, it is susceptible to alkaline hydrolysis as compared with the backbone-bonded esters having substantial steric hindrance. For these reasons, the recurring unit having formula (3) is hydrolyzed upon treatment of the resist film with alkaline developer, to produce a highly hydrophilic carboxyl group (—$CO_2H$) or hydroxyl group (—OH) as illustrated by the following scheme. In this way, the water repellent unit (3) is converted to a hydrophilic unit (3a). This contributes to the prevention of blob defects.

Herein, $R^7$, Rf, A, p, and q are as defined above.

A proper choice of $R^7$, Rf, A, p, and q in formula (3) from their lists of alternatives makes it possible to tailor the surface segregation, water repellency and hydrolysis of a fluorinated polymer as desired, and eventually to tailor optimum the water repellency and water slip of a resist composition comprising the same and the surface state after development, thus contributing to reduction of defects in the immersion lithography.

The recurring unit having formula (3) may be used alone or in admixture of two or more types. A proportion of the recurring unit having formula (3) is preferably at least 5 mol %, more preferably at least 20 mol % based on the entire recurring units of the fluorinated polymer (E). Too low a proportion may fail to achieve the desired effect.

As alluded to above, the fluorinated polymer comprising recurring units having formula (3) which is optionally compounded in the resist composition is effective for reducing defect formation in the immersion lithography. However, when the fluorinated polymer is used in combination with a common quencher and acid generator, problems such as poor shelf stability and insufficient resolution can arise. The problem of shelf stability arises because the highly reactive ester carbonyl carbon in the recurring unit having formula (3) is under nucleophilic attack by the quencher itself or nucleophilic attack with the quencher serving as a base catalyst, and thus undergoes decomposition during shelf storage of the resist composition. This problem may be addressed by using a quencher having very low reactivity and basicity. With such a quencher, shelf stability may be improved, but resolution is not sufficient. Through extensive investigations, the inventors have found that the requirements including defect prevention in immersion lithography, storage stability and high resolution can be met at a high level by using a tertiary amine compound having formula (1) or (1a) as the quencher and a photoacid generator having formula (2) or (2a) as the acid generator, and combining them with the fluorinated polymer comprising recurring units having formula (3).

In addition to the recurring units having formula (3), the fluorinated polymer which is optionally compounded herein may further comprise recurring units of one or more type having the general formula (4):

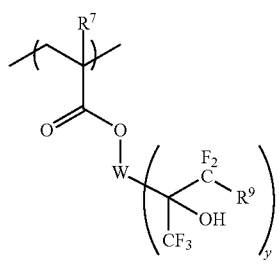

(4)

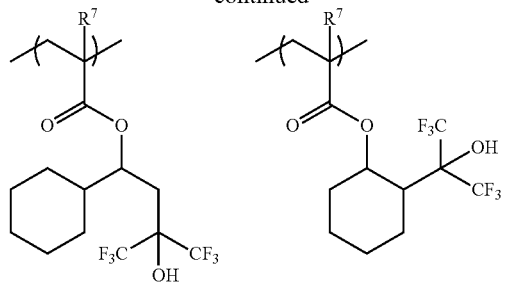

wherein R⁷ is hydrogen or methyl, R⁹ is each independently hydrogen, fluorine, or a single bond to W to form a ring, W is a $C_1$-$C_{30}$ organic group having a valence of (y+1) or may bond with R⁹ to form a ring, and y is an integer of 1 to 5, preferably 1 to 3. Then the fluorinated polymer is more effective for preventing the resist composition from forming defects in the immersion lithography.

In formula (4), R⁷ is hydrogen or methyl. R⁹ is each independently hydrogen, fluorine, or a single bond to W to form a ring. The subscript y is an integer of 1 to 5, preferably 1 to 3. W is a $C_1$-$C_{30}$ organic group having a valence of (y+1). The organic group of W may be straight, branched or cyclic and may contain a heteroatom such as oxygen, halogen, nitrogen or sulfur. Of these heteroatoms, fluorine and oxygen are more preferred, and the organic group may have an oxygen functional group such as an ether, ester, acetal or hydroxyl group. W is a (y+1)-valent $C_1$-$C_{30}$ organic group which is derived by eliminating a number "y" of hydrogen atoms from a straight, branched or cyclic, monovalent $C_1$-$C_{30}$ organic group which may contain a heteroatom. Examples of the monovalent $C_1$-$C_{30}$ organic group include, but are not limited to, straight, branched or cyclic alkyl, alkenyl, aryl, and aralkyl groups such as methyl, ethyl, propyl, isopropyl, butyl, isobutyl, s-butyl, t-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosyl, allyl, benzyl, diphenylmethyl, tetrahydrofurfuryl, methoxymethyl, ethoxymethyl, trifluoroethyl, (2-methoxyethoxy)methyl, acetoxymethyl, phenyl, naphthyl, tolyl, xylyl, trimethylphenyl, methoxyphenyl, methylthiophenyl, acetamidophenyl, 7-oxanorbornyl, acetoxymethyl, acetoxyethyl, acetoxypropyl, acetoxybutyl, methoxycarbonylmethyl, methoxycarbonylethyl, methoxycarbonylpropyl, methoxycarbonylbutyl, methoxycarbonylcyclohexyl, and methoxycarbonyladamantyl. Alternatively, W may bond with R⁹ to form a ring.

Illustrative non-limiting examples of the recurring unit having formula (4) are given below. Herein R⁷ stands for hydrogen or methyl.

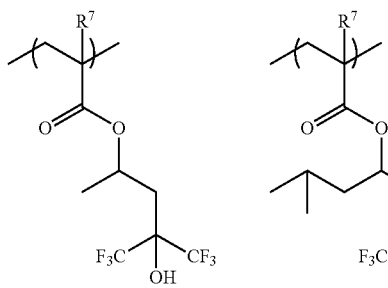
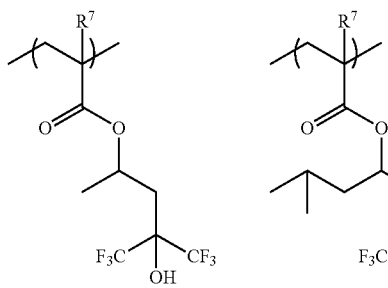

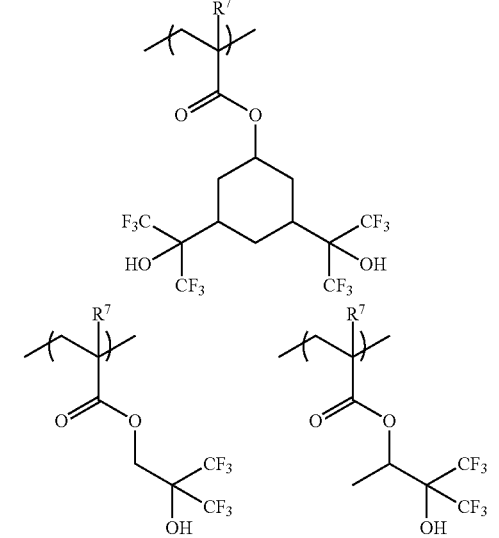

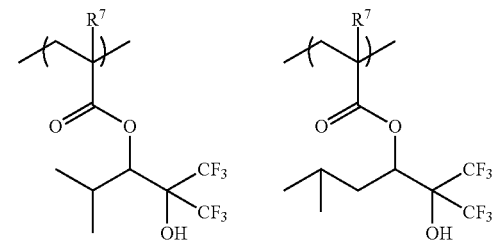

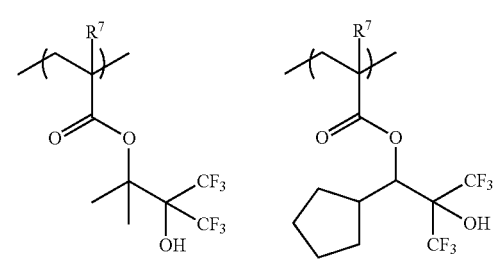

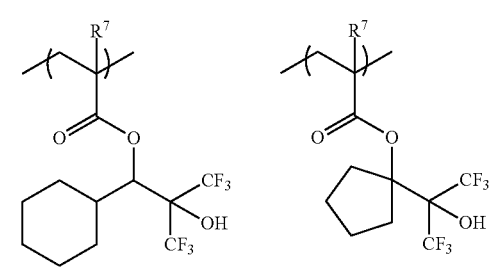

-continued

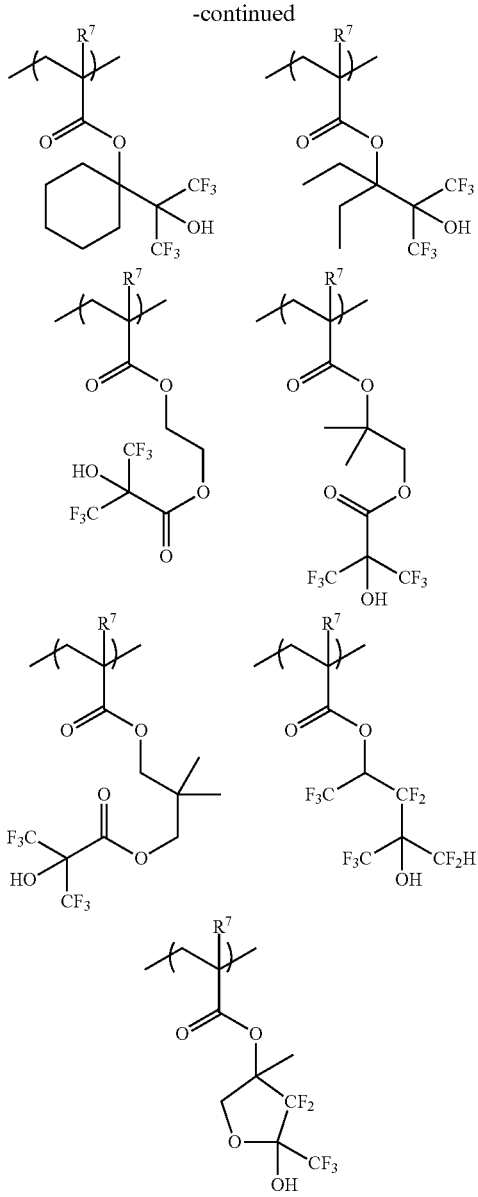

The recurring unit having formula (4) may be used alone or in admixture of two or more types. A proportion of the recurring unit having formula (4) is preferably 10 mol % to less than 95 mol %, more preferably 20 mol % to 80 mol % based on the entire recurring units of the fluorinated polymer (E). Too low a proportion may fail to achieve the desired effect whereas too high a proportion may detract from the defect prevention.

In addition to the recurring units having formulae (3) and (4), the fluorinated polymer may further comprise other recurring units of one or more types selected from well-known units. Suitable additional recurring units are described in US 20100266957 (JP-A 2010-250105, paragraphs [0028] to [0065]).

The fluorinated polymer (E) may be synthesized by general polymerization techniques, for example, radical polymerization using a polymerization initiator such as 2,2'-azobisisobutyronitrile or anionic polymerization using alkyl lithium. Polymerization may be performed in a standard manner. Preferably the fluorinated polymer (E) may be synthesized by radical polymerization. The polymerization conditions including temperature, pressure and concentration may vary with the type and amount of an initiator, solvent, additive and the like.

Although the radical polymerization initiator used herein is not particularly limited, suitable examples include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxide compounds such as tert-butyl peroxypivalate, lauroyl peroxide, benzoyl peroxide, and tert-butyl peroxylaurate; water-soluble polymerization initiators such as potassium persulfate; and redox initiators comprising a peroxide (e.g., potassium persulfate or hydrogen peroxide) combined with a reducing agent (e.g., sodium sulfite). The amount of polymerization initiator used may vary with its type and polymerization conditions and is usually selected from the range of 0.001 to 10 mol %, preferably 0.01 to 6 mol % based on the total moles of monomers to be polymerized.

During the synthesis of the fluorinated polymer, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

Specifically, the fluorinated polymer (E) is synthesized by combining polymerizable monomers corresponding to recurring units of formulae (3) and (4) and additional recurring units, adding an initiator and chain transfer agent as illustrated above, and effecting polymerization.

If desired, polymerization may be performed in a solvent. The solvent is preferably selected from those solvents that do not interfere with polymerization, for example, esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran. The solvents may be used alone or in admixture. While the amount of solvent used varies with the desired degree of polymerization (or molecular weight), the amount of initiator, temperature and other polymerization conditions, the solvent is typically used in such amounts that the concentration of monomers to be polymerized is 0.1 to 95% by weight, more preferably 5 to 90% by weight.

While the temperature of polymerization reaction varies with the type of a polymerization initiator and the boiling point of a solvent, it is typically 20 to 200° C., preferably 50 to 140° C. Any desire vessel may be used for polymerization reaction.

From the resulting polymer solution or dispersion, the organic solvent as the reaction medium or water may be removed by any well-known techniques, for example, reprecipitation and filtration, or distillation at an elevated temperature and reduced pressure.

The fluorinated polymer (E) should preferably have a weight average molecular weight (Mw) of 1,000 to 500,000, more preferably 2,000 to 30,000, as measured versus polystyrene standards by gel permeation chromatography (GPC) using tetrahydrofuran solvent. A fluorinated polymer with too low a Mw is readily miscible with resist material and soluble in water whereas a fluorinated polymer with too high a Mw may interfere with film formation by spin coating or cause more development defects.

The invention provides a chemically amplified resist composition comprising (A) one or more tertiary amine compounds having formula (1), (B) one or more acid generators having formula (2), (C) a base resin having an acidic functional group protected with an acid labile group, which is insoluble or substantially insoluble in alkaline developer and turns soluble in alkaline developer upon deprotection of the acid labile group, (D) an organic solvent as essential components, and (E) a fluorinated polymer and (F) a surfactant as optional components. Of these, components (A), (B) and (E) are as described above.

Base Resin

The base resins or polymers used as component (C) in the inventive resist compositions include polyhydroxystyrene (PHS), and copolymers of hydroxystyrene with styrenes, (meth)acrylic acid esters or other polymerizable olefinic compounds, for KrF excimer laser resist use; (meth)acrylic acid ester polymers, alternating copolymers of cycloolefin with maleic anhydride, copolymers further containing vinyl ethers or (meth)acrylic acid esters, polynorbornene, and products of ring-opening metathesis polymerization of cycloolefins, for ArF excimer laser resist use; and fluorinated forms of the foregoing polymers (for both KrF and ArF laser uses) and polymers resulting from ring-closure polymerization using fluorinated dienes for $F_2$ laser resist use. Silicon-substituted forms of the foregoing polymers and polysilsesquioxane polymers are useful for the bilayer resists. The base resin is not limited to the polymers of these systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile group to be introduced into the base polymer may be selected from a variety of such groups, preferably from acetal groups of 2 to 30 carbon atoms and tertiary alkyl groups of 4 to 30 carbon atoms having the formulae (C1) and (C2), respectively.

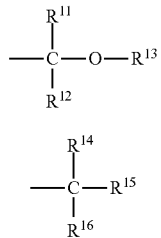

In formulae (C1) and (C2), $R^{11}$ and $R^{12}$ each are hydrogen or a straight, branched or cyclic alkyl group of 1 to 20 carbon atoms, preferably 1 to 12 carbon atoms, which may contain a hetero atom such as oxygen, sulfur, nitrogen or fluorine, $R^{13}$, $R^{14}$, $R^{15}$ and $R^{16}$ each are a straight, branched or cyclic alkyl group of 1 to 20 carbon atoms, preferably 1 to 12 carbon atoms, an aryl group or an aralkyl group, which may contain a hetero atom such as oxygen, sulfur, nitrogen or fluorine. A pair of $R^{11}$ and $R^{12}$, a pair of $R^{11}$ and $R^{13}$, a pair of $R^{12}$ and $R^{13}$, a pair of $R^{14}$ and $R^{15}$, a pair of $R^{14}$ and $R^{16}$, or a pair of $R^{15}$ and $R^{16}$, taken together, may form a non-aromatic ring of 3 to 20 carbon atoms, preferably 3 to 12 carbon atoms, with the carbon or oxygen atom to which they are attached.

Illustrative examples of the acetal group of formula (C1) include, but are not limited to, methoxymethyl, ethoxymethyl, propoxymethyl, butoxymethyl, isopropoxymethyl, t-butoxymethyl, neopentyloxymethyl, (1-methylcyclohexyl) methoxymethyl, 2-adamantyloxymethyl, (1-adamantyl) methoxymethyl, fenchyloxymethyl, (2-methyl-2-norbornyl) methoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (C2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo [5.2.1.0$^{2,6}$]decyl, 3-methyl-3-tetracyclo[4.4.0.1$^{2,5}$.1$^{7,10}$] dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydroxyl groups may be substituted with acid labile groups of the following general formula (C3a) or (C3b) for crosslinkage between molecules or within a molecule.

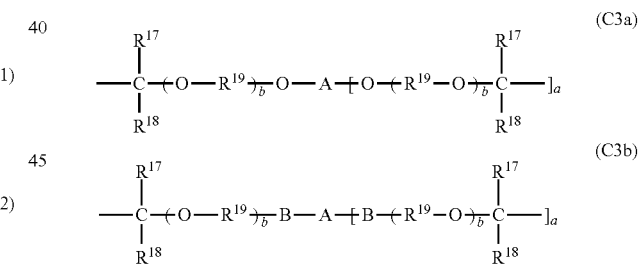

Herein, $R^{17}$ and $R^{18}$ each are hydrogen or a straight, branched or cyclic $C_1$-$C_8$ alkyl group, or $R^{17}$ and $R^{18}$, taken together, may form a ring with the carbon atom to which they are attached, with the proviso that each of $R^{17}$ and $R^{18}$ is a straight or branched $C_1$-$C_8$ alkylene group when they form a ring. $R^{19}$ is a straight, branched or cyclic $C_1$-$C_{10}$ alkylene group. Letter "a" is an integer of 1 to 7, and "b" is 0 or an integer of 1 to 10. "A" is a (a+1)-valent chain-like or alicyclic saturated hydrocarbon group, aromatic hydrocarbon group or heterocyclic group of 1 to 50 carbon atoms, which may have an intervening heteroatom and in which the hydrogen atom attached to a carbon atom may be partially replaced by a hydroxyl group, carboxyl group, carbonyl group or fluorine atom. B is —CO—O—, —NHCO—O— or —NHCONH—.

Illustrative examples of the crosslinking acetal linkages represented by formulae (C3a) and (C3b) are given below as (C3)-1 through (C3)-8, but not limited thereto.

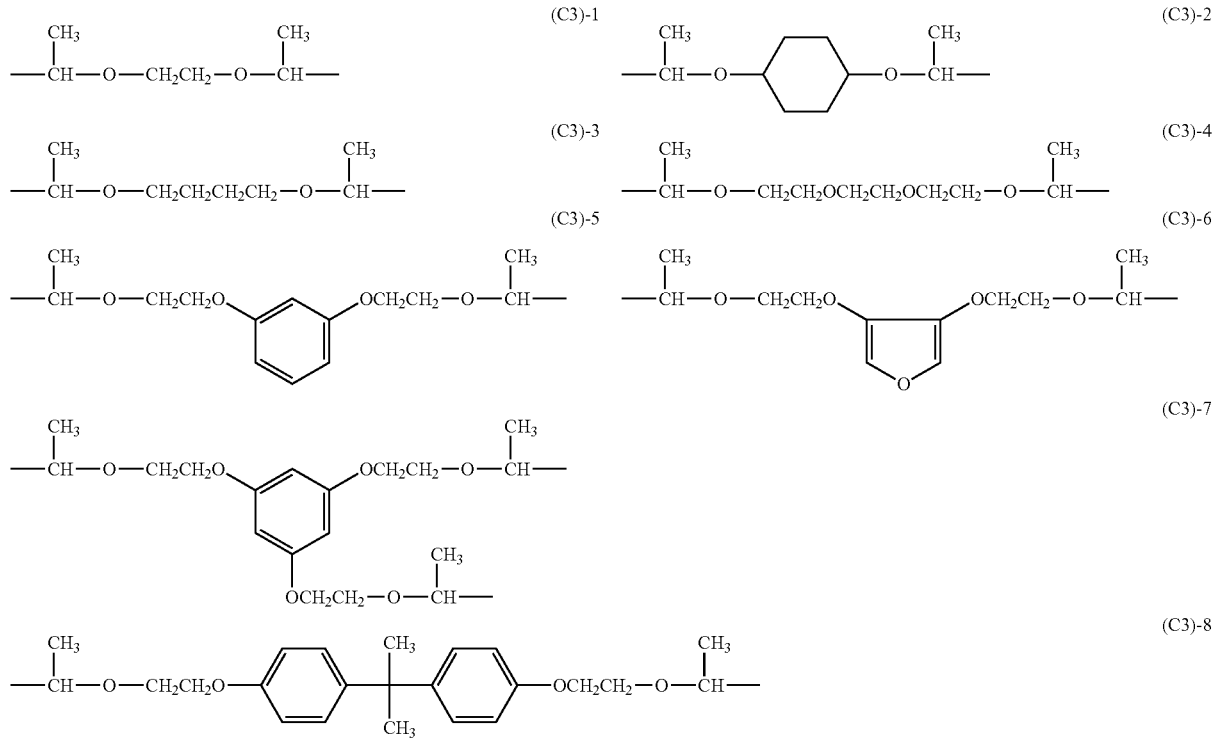

Preferably the base polymer has a weight average molecular weight (Mw) of 2,000 to 100,000, as determined versus polystyrene standards by GPC using tetrahydrofuran as elute solvent. With Mw below 2,000, film formation and resolution may become poor. With Mw beyond 100,000, resolution may become poor or foreign matter may generate during pattern formation.

When the chemically amplified positive resist composition of the invention is used as a resist material in the ArF excimer laser lithography, the base resin is preferably selected from those described in U.S. Pat. No. 7,537,880 (JP-A 2008-111103, paragraphs [0072] to [0121]).

Specifically the base resin used herein includes those polymers comprising units of the following formula (R1) and/or (R2).

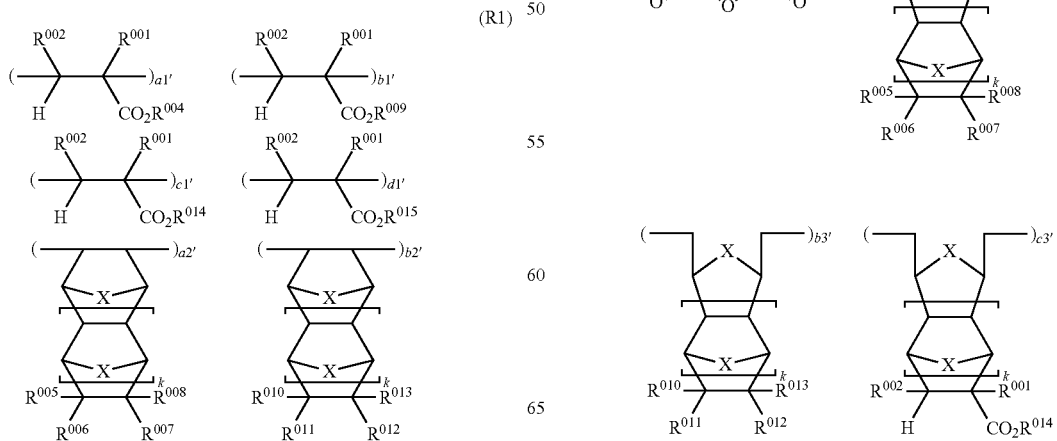

-continued

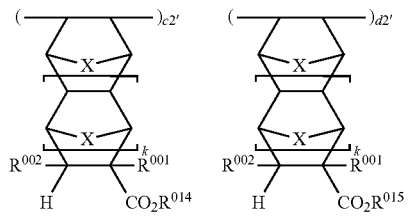

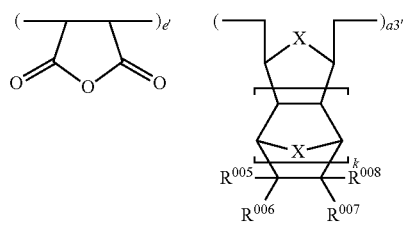

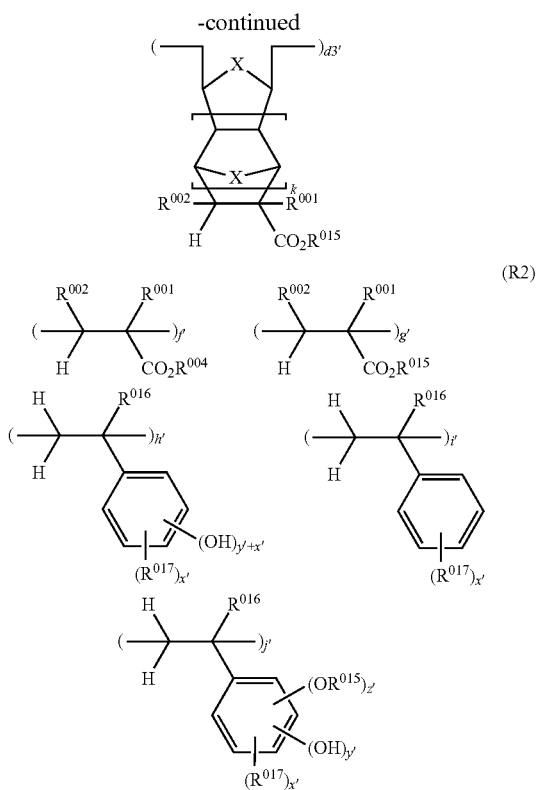

Herein, $R^{001}$ is hydrogen, methyl or $CH_2CO_2R^{003}$.

$R^{002}$ is hydrogen, methyl or $CO_2R^{003}$.

$R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxyl, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl.

Suitable straight, branched or cyclic $C_1$-$C_{15}$ alkyl groups are as exemplified for $R^{003}$.

Two of $R^{005}$ to $R^{008}$ may bond together to form a ring with the carbon atom(s) to which they are attached, and in that event, at least one of $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds or straight, branched or cyclic $C_1$-$C_{15}$ alkylene groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkylene groups are those exemplified for $R^{003}$, with one hydrogen atom eliminated therefrom.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ may bond together to form a ring with the carbon atom(s) to which they are attached, and in that event, at least one of $R^{010}$ to $R^{013}$ is a divalent hydrocarbon group of 1 to 15 carbon atoms containing a —$CO_2$— partial structure, while the remaining R's are independently single bonds or straight, branched or cyclic $C_2$-$C_{15}$ alkylene groups. Illustrative examples of suitable divalent $C_2$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkylene groups are as exemplified for $R^{003}$, with one hydrogen atom eliminated therefrom.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group, examples of which will be described below.

$R^{016}$ is hydrogen or methyl.

$R^{017}$ is a straight, branched or cyclic $C_1$-$C_8$ alkyl group.

X is —$CH_2$ or an oxygen atom. Letter k is 0 or 1.

In formula (R1), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', and j' are numbers from 0 to less than 1, satisfying f'+g'+h'+i'+j'=1; x', y' and z' are each an integer of 0 to 3, satisfying 1≤x'+y'+z'≤5 and 1≤y'+z'≤3.

The acid labile group represented by $R^{O15}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

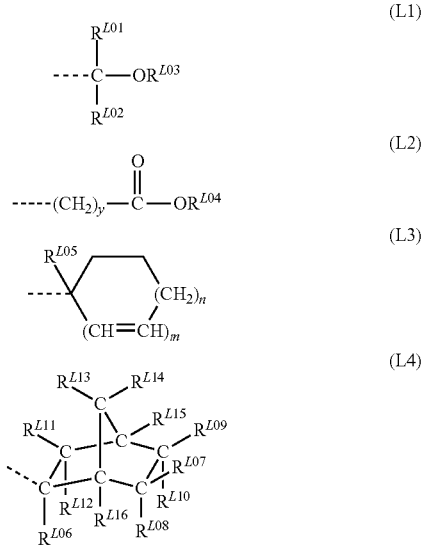

In these formulae, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include straight, branched or cyclic alkyl groups and substituted forms of such alkyl groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$, and suitable substituted alkyl groups are shown below.

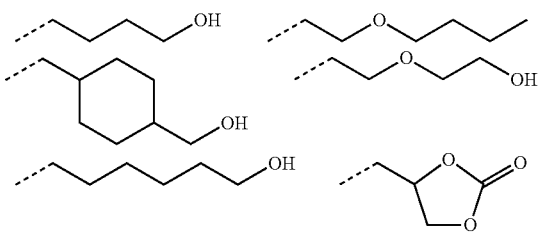

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups, and similar groups in which one or more methylene moiety is replaced by oxygen or sulfur atom. Examples of the optionally substituted aryl groups include phenyl, methylphenyl, naphthyl, anthryl, phenanthryl, and pyrenyl. Letter m is equal to 0 or 1, n is equal to 0, 1, 2 or 3, and 2 m+n is equal to 2 or 3.

In formula (L4), $R^{L06}$ is a substituted or unsubstituted, straight, branched or cyclic $C_1$-$C_{10}$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

The polymer comprising recurring units of formula (R1) and/or (R2) may further comprise acid generator units corresponding to formula (2) as additional recurring units.

Solvent

The organic solvent (D) used herein may be any organic solvent in which the base resin, amine compound, acid generator, and other components are soluble. Illustrative, non-limiting, examples of the organic solvent include ketones such as cyclopentanone, cyclohexanone, 4-methyl-2-pentanone and methyl amyl ketone; alcohols such as 3-methoxybutanol, 3-methyl-3-methoxybutanol, 1-methoxy-2-propanol, 1-ethoxy-2-propanol, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-t-amyl ether, and di-n-hexyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and carbonates such as ethylene carbonate and propylene carbonate. These solvents may be used alone or in combinations of two or more thereof. Of the above organic solvents, it is recommended to use propylene glycol monomethyl ether, PGMEA, cyclohexanone, γ-butyrolactone, ethyl lactate, and mixtures thereof because the base resin and acid generator are most soluble therein.

While the amount of the organic solvent used may be determined depending on the desired film thickness and the like, the solvent is typically used in an amount of 200 to 15,000 parts, preferably 400 to 8,000 parts by weight per 100 parts by weight of the base resin.

Optionally, the resist composition may further comprise (F) a surfactant which is commonly used for facilitating coating operation. The surfactant used herein is not particularly limited, and may be selected from a wide variety of known surfactants. Reference may be made to, for example, US 20090274978 (JP-A 2009-269953, paragraphs [0142] to [0149]).

Preferred among known surfactants are FC-4430 (3M-Sumitomo Co., Ltd.), Surflon S-381, Surfynol E1004, KH-20 and KH-30 (AGC Seimi Chemical Co., Ltd.), and products of ring-opening polymerization of oxetane. The surfactants may be used alone or in admixture.

In the resist composition, the surfactant is typically used in an amount of up to 2 parts, preferably up to 1 part by weight per 100 parts by weight of the base resin.

If desired, other known additives such as dissolution regulators, acetylene alcohols, acidic compounds, dyes, thermal crosslinkers, and stabilizers may be added to the resist composition. Exemplary dissolution regulators are described in JP-A 2008-122932, paragraphs [0155] to [0178], and exemplary acetylene alcohols in paragraphs [0179] to [0182].

Process

Pattern formation using the resist composition of the invention may be performed by well-known lithography processes. The process generally involves coating, prebake, exposure, bake (PEB), and development. If necessary, any additional steps may be added.

For pattern formation, the resist composition is first applied onto an integrated circuit-forming substrate (e.g., Si, $SiO_2$, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for 0.1 to 10 minutes, preferably 80 to 140° C. for 0.5 to 5 minutes. The resulting resist film is generally 0.05 to 2.0 µm thick.

With a mask having a desired pattern placed above the resist film, the resist film is then exposed to high-energy radiation such as UV, DUV, EUV, excimer laser light, EB, x-ray, γ-ray and synchrotron radiation, preferably radiation having a wavelength of up to 300 nm. The exposure dose is preferably 1 to 200 $mJ/cm^2$, more preferably 10 to 100 $mJ/cm^2$. For the exposure step in the process of patterning the resist composition, either the conventional lithography or the immersion lithography of holding a liquid, typically water between the projection lens and the resist film may be applicable. In the case of immersion lithography, a topcoat process involving coating a top coat on the resist film prior to exposure is possible.

The film is further baked (PEB) on a hot plate at 60 to 150° C. for 0.1 to 5 minutes, preferably 80 to 140° C. for 0.5 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. If desired, the development may be followed by further heat treatment (i.e., thermal flow) or chemical shrink treatment for adjusting the pattern size. The resist composition may also be used as a positive resist in the double patterning process.

It is appreciated that the resist composition of the invention is suited for micropatterning using such high-energy radiation as DUV or excimer laser radiation with a wavelength of 120 to 260 nm, EUV, x-ray, or EB.

EXAMPLE

Examples of the invention are given below by way of illustration and not by way of limitation.

Examples and Comparative Examples

Chemically amplified resist compositions within the scope of the invention were prepared, and patterns were formed therefrom by the inventive process. The compositions were evaluated for shelf stability, resolution, and defects.

Examples and Comparative Examples used a base resin, acid generator, quencher, polymer for immersion lithography protective film, and fluorinated polymer, which are identified below by their structural formulae. Mw and Mn are measured versus polystyrene standards by GPC using tetrahydrofuran as elute solution, and Mw/Mn is a molecular weight dispersity.

Polymer 1
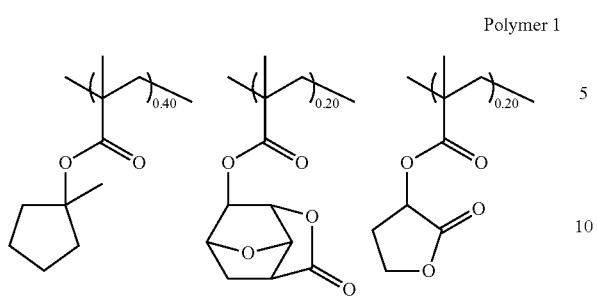
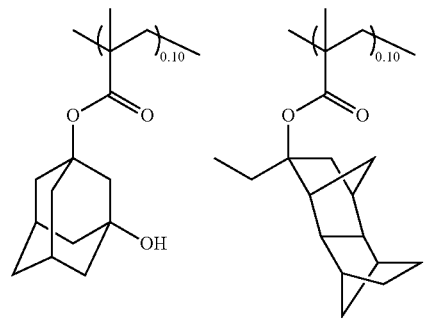
Mw = 8,500
Mw.Mn = 1.52
PAG 1
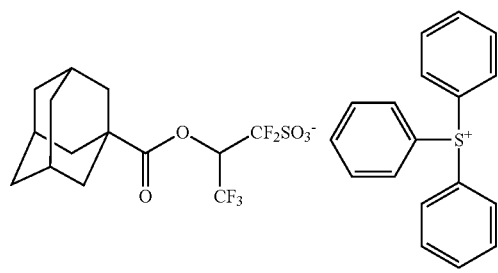
PAG 2
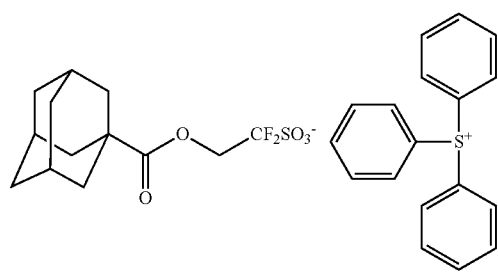
PAG 3
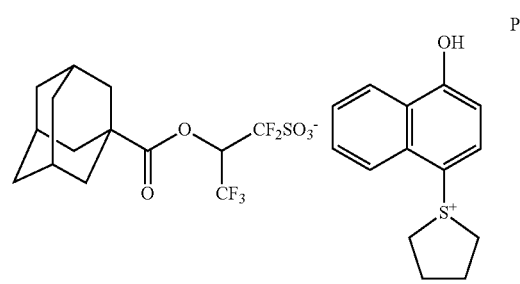
PAG 4
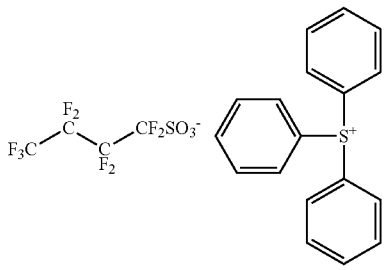
Q-1
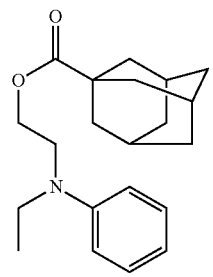
Q-2
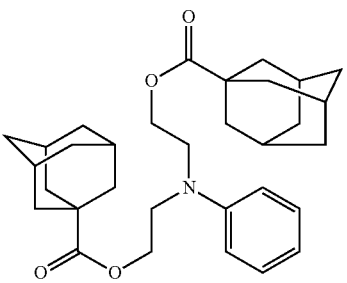
Q-3
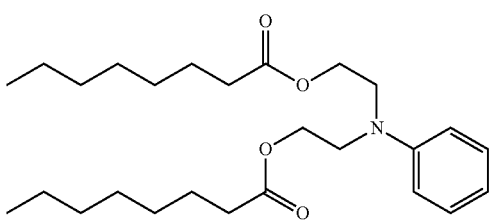
Q-4
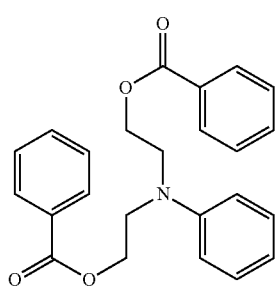
Q-5
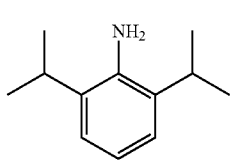

Q-6

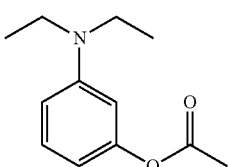

Q-7

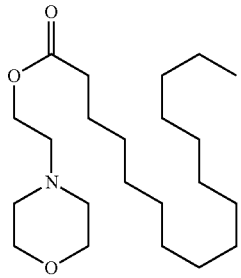

Polymer 2

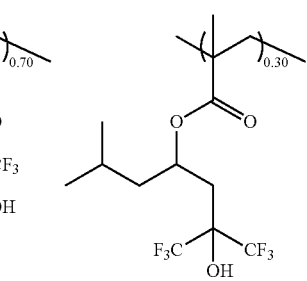

Mw = 8,800
Mw/Mn = 1.69

Polymer 3

Mw = 6,800
Mw/Mn = 1.47

Polymer 4

Mw = 6,700
Mw/Mn = 1.45

Polymer 5

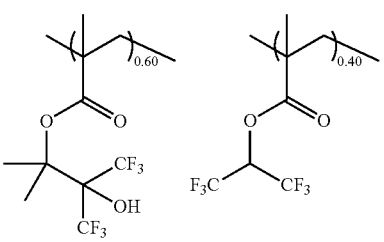

Mw = 6,600
Mw/Mn = 1.43

Resist Preparation and Lithography Test A

Example 1-1

A resist composition was prepared by mixing the following components and filtering the solution through a Teflon® filter with a pore size of 0.1 μm.

| | | | |
|---|---|---|---|
| (A) | Quencher | Q-1 | 2.0 pbw |
| (B) | Acid generator | PAG1 | 14.3 pbw |
| (C) | Base resin | Polymer 1 | 100 pbw |
| (D) | Organic solvent | PGMEA | 2,750 pbw |
| | | Cyclohexanone | 306 pbw |
| (F) | Surfactant | FC-4430* | 0.01 pbw |

*commercially available from 3M-Sumitomo Co., Ltd.

Examples 1-2 to 1-4 & Comparative Examples 1-1 to 1-4

Resist compositions were prepared as in Example 1-1 by mixing the components and filtering the solution through a Teflon® filter with a pore size of 0.1 μm. Component (A) and/or (B) was changed as shown in Table 1 while the same components (C), (D) and (F) were used in the same amounts as Example 1-1.

TABLE 1

| Resist | | A (pbw) | B (pbw) |
|---|---|---|---|
| Example 1-1 | Resist 1 | Q-1 (2.0) | PAG 1 (14.3) |
| Example 1-2 | Resist 2 | Q-2 (3.1) | PAG 2 (12.8) |
| Example 1-3 | Resist 3 | Q-3 (2.6) | PAG 3 (27.2) |
| Example 1-4 | Resist 4 | Q-4 (2.4) | PAG 3 (27.2) |
| Comparative Example 1-1 | Comparative Resist 1 | Q-2 (3.1) | PAG 4 (12.3) |
| Comparative Example 1-2 | Comparative Resist 2 | Q-5 (1.1) | PAG 1 (14.3) |
| Comparative Example 1-3 | Comparative Resist 3 | Q-6 (1.3) | PAG 3 (27.2) |
| Comparative Example 1-4 | Comparative Resist 4 | Q-7 (2.4) | PAG 3 (27.2) |

Preparation of Protective Film Material

A protective film or topcoat material (TC-1) for immersion lithography was prepared by mixing the components in Table 2 and filtering the solution through a Teflon® filter with a pore size of 0.1 μm.

TABLE 2

| Protective film material | Polymer (pbw) | Organic solvent (pbw) |
|---|---|---|
| TC-1 | Polymer 2 (100) | isoamyl ether (2700) 2-methyl-1-butanol (270) |

Tests

Evaluation of Resolution by ArF Immersion Lithography (Using Protective Film)

Examples 2-1 to 2-4 and Comparative Examples 2-1 to 2-4

On a silicon substrate, an antireflective coating solution (ARC-29A by Nissan Chemical Industries, Ltd.) was coated and baked at 200° C. for 60 seconds to form an ARC film of 100 nm thick. The resist solution was spin coated on the ARC and baked on a hot plate at 120° C. for 60 seconds to form a resist film of 90 nm thick. Then the topcoat material TC-1 was coated onto the resist film and baked at 90° C. for 60 seconds to form a protective film of 50 nm thick. Using an ArF excimer laser scanner NSR-S610C (Nikon Corp., NA 1.30, cross-pole illumination, blade angle 70 deg., 6% halftone phase shift mask), the resist film was subjected to immersion lithography exposure. After the exposure, the film was baked (PEB) at 100° C. for 60 seconds and developed with a 2.38 wt % aqueous solution of tetramethylammonium hydroxide for 60 seconds to form a 1:1 line-and-space pattern.

The pattern-bearing wafer was observed under a top-down scanning electron microscope (SEM). The optimum dose was the exposure dose which provided 1:1 resolution at the top and bottom of a 50-nm line-and-space pattern. The maximum resolution was the minimum line width (on-mask size, in increments of 1 nm) of a 1:1 line-and-space pattern which was ascertained separate at the optimum dose, with smaller values indicating better resolution. From a cross-sectional image under SEM, the profile of a 50-nm 1:1 line-and-space pattern was observed. The results are shown in Table 3.

TABLE 3

| | Resist | Maximum resolution | Pattern profile |
|---|---|---|---|
| Example 2-1 | Resist 1 | 46 nm | rectangular |
| Example 2-2 | Resist 2 | 47 nm | rectangular |
| Example 2-3 | Resist 3 | 44 nm | rectangular |
| Example 2-4 | Resist 4 | 44 nm | rectangular |
| Comparative Example 2-1 | Comparative Resist 1 | 50 nm unresolved | marked film loss |
| Comparative Example 2-2 | Comparative Resist 2 | 50 nm | rounded top, footing |
| Comparative Example 2-3 | Comparative Resist 3 | 50 nm | rounded top, footing |
| Comparative Example 2-4 | Comparative Resist 4 | 46 nm | rectangular |

As is evident from these results, the inventive resist compositions exhibited a high resolution. Poor resolution was found in Comparative Example 2-1 using a common acid generator for ArF resist material as component (B) or acid generator, and in Comparative Examples 2-2 and 2-3 using common aniline compounds as component (A) or quencher.

Evaluation of Shelf Stability

Examples 3-1 to 3-4 and Comparative Example 3-1

Those resist compositions which exhibited satisfactory resolution were aged at 25° C. for 3 months before they were evaluated for resolution again. The test method was the same as above. The results are shown in Table 4.

TABLE 4

| | Resist | Maximum resolution | Pattern profile |
|---|---|---|---|
| Example 3-1 | Resist 1 | 46 nm | rectangular |
| Example 3-2 | Resist 2 | 47 nm | rectangular |
| Example 3-3 | Resist 3 | 44 nm | rectangular |
| Example 3-4 | Resist 4 | 44 nm | rectangular |
| Comparative Example 3-1 | Comparative Resist 4 | 50 nm unresolved | marked film loss |

It is evident from these results that the inventive resist compositions had good shelf stability since their resolution remained unchanged after 3 months of storage. A degradation of resolution with time was found in Comparative Example 3-1 using a common tertiary amine compound as component (A) or quencher. This is probably because the quencher participated in decomposition of the acid generator during storage of the resist composition.

Resist Preparation and Lithography Test B

Example 4-1

A resist composition was prepared by mixing the following components and precision filtering the solution through a high-density polyethylene (HDPE) filter with a pore size of 0.02 μm.

| (A) | Quencher | Q-3 | 2.6 pbw |
| (B) | Acid generator | PAG1 | 14.3 pbw |
| (C) | Base resin | Polymer 1 | 100 pbw |
| (D) | Organic solvent | PGMEA | 2,750 pbw |
| | | Cyclohexanone | 306 pbw |
| (E) | Fluorinated polymer | Polymer 3 | 8.8 pbw |
| (F) | Surfactant | FC-4430* | 0.01 pbw |

*commercially available from 3M-Sumitomo Co., Ltd.

Examples 4-2 to 4-4 & Comparative Examples 4-1 to 4-4

Resist compositions were prepared as in Example 4-1 by mixing the components and precision filtering the solution through a HDPE filter with a pore size of 0.02 μm. Component (A), (B) and/or (F) was changed as shown in Table 5 while the same components (C), (D) and (F) were used in the same amounts as Example 4-1.

TABLE 5

| | Resist | A (pbw) | B (pbw) | E (pbw) |
|---|---|---|---|---|
| Example 4-1 | Resist 5 | Q-3 (2.6) | PAG 1 (14.3) | Polymer 3 (8.8) |
| Example 4-2 | Resist 6 | Q-3 (2.6) | PAG 2 (12.8) | Polymer 4 (8.8) |

TABLE 5-continued

|  | Resist | A (pbw) | B (pbw) | E (pbw) |
|---|---|---|---|---|
| Example 4-3 | Resist 7 | Q-1 (2.0) | PAG 3 (27.2) | Polymer 3 (8.8) |
| Example 4-4 | Resist 8 | Q-1 (2.0) | PAG 3 (27.2) | Polymer 4 (8.8) |
| Comparative Example 4-1 | Comparative Resist 5 | Q-3 (2.6) | PAG 1 (14.3) | Polymer 5 (8.8) |
| Comparative Example 4-2 | Comparative Resist 6 | Q-7 (2.4) | PAG 1 (14.3) | Polymer 3 (8.8) |
| Comparative Example 4-3 | Comparative Resist 7 | Q-7 (2.4) | PAG 1 (14.3) | Polymer 4 (8.8) |
| Comparative Example 4-4 | Comparative Resist 8 | Q-6 (1.3) | PAG 1 (14.3) | Polymer 3 (8.8) |

Tests

Evaluation of Resolution by ArF Immersion Lithography (without Protective Film)

Examples 5-1 to 5-4 and Comparative Examples 5-1 to 5-4

On a silicon substrate, an antireflective coating solution (ARC-29A by Nissan Chemical Industries, Ltd.) was coated and baked at 200° C. for 60 seconds to form an ARC film of 100 nm thick. The resist solution was spin coated on the ARC and baked on a hot plate at 120° C. for 60 seconds to form a resist film of 90 nm thick. Using an ArF excimer laser scanner NSR-S610C (Nikon Corp., NA 1.30, cross-pole illumination, blade angle 70 deg., 6% halftone phase shift mask), the resist film was subjected to immersion lithography exposure. After the exposure, the film was baked (PEB) at 100° C. for 60 seconds and developed with a 2.38 wt % aqueous solution of tetramethylammonium hydroxide for 60 seconds to form a 1:1 line-and-space pattern.

The pattern-bearing wafer was observed under a top-down SEM. The optimum dose was the exposure dose which provided 1:1 resolution at the top and bottom of a 50-nm line-and-space pattern. The maximum resolution was the minimum line width (on-mask size, in increments of 1 nm) of a 1:1 line-and-space pattern which was ascertained separate at the optimum dose, with smaller values indicating better resolution.

Evaluation of Immersion Defects by ArF Immersion Lithography (without Protective Film)

Examples 5-1 to 5-4 and Comparative Examples 5-1 to 5-4

A pattern-bearing wafer was similarly prepared using each of the resist compositions. The number of watermark defects on the pattern was counted by means of a flaw detector system combined with SEM. The watermark (WM) is detected as a circular spread where waved pattern features extend across several lines. It is believed that the watermark defect is caused by a residual water droplet originating from the immersion water. Thus the resist film tends to suffer watermark defects when its surface is short of water repellency.

In a separate run, an antireflective coating ARC-29A (Nissan Chemical Industries, Ltd.) of 87 nm thick was deposited on a 8-inch silicon substrate. Each resist solution was applied onto the ARC and baked at 120° C. for 60 seconds to form a resist film of 100 nm thick. Using an ArF scanner model S307E (Nikon Corp., NA 0.85), the entire surface of the wafer was subjected to checkered-flag exposure including alternate exposure of open-frame exposed and unexposed portions having an area of 20 mm square. This was followed by baking (PEB) at 100° C. for 60 seconds and development with a 2.38 wt % TMAH aqueous solution for 60 seconds. Using a flaw detector Win-Win 50-1200 (Tokyo Seimitsu Co., Ltd.), the number of defects in the unexposed portion of the checkered-flag was counted at the pixel size of 0.125 µm. The defects formed on the resist surface in the unexposed portion are satellite spot defects and classified into blob defects.

The results of resolution and defect formation are shown in Table 6.

TABLE 6

|  | Resist | Maximum resolution | Watermark defects | Blob defects |
|---|---|---|---|---|
| Example 5-1 | Resist 5 | 46 nm | 3 | 15 |
| Example 5-2 | Resist 6 | 47 nm | 4 | 13 |
| Example 5-3 | Resist 7 | 44 nm | 2 | 18 |
| Example 5-4 | Resist 8 | 44 nm | 3 | 16 |
| Comparative Example 5-1 | Comparative Resist 5 | 48 nm | 9 | 2,000 |
| Comparative Example 5-2 | Comparative Resist 6 | 46 nm | 5 | 20 |
| Comparative Example 5-3 | Comparative Resist 7 | 46 nm | 5 | 19 |
| Comparative Example 5-4 | Comparative Resist 8 | 50 nm | 7 | 23 |

As is evident from these results, the inventive resist compositions exhibited a high resolution and minimized defect formation associated with the immersion lithography. Poor resolution was found in Comparative Example 5-4 using a common aniline compound as component (A) or quencher. Blob defects could not be controlled in Comparative Example 5-1 using a polymer free of recurring units having formula (3) as component (F) or fluorinated polymer.

Evaluation of Shelf Stability

Examples 6-1 to 6-4 and Comparative Examples 6-1, 6-2

Those resist compositions which exhibited satisfactory resolution and defect control were aged at 25° C. for 1 month before they were evaluated for resolution and watermark defects again. The test methods were the same as above. The results are shown in Table 7.

TABLE 7

|  | Resist | Maximum resolution | Watermark defects |
|---|---|---|---|
| Example 6-1 | Resist 5 | 46 nm | 2 |
| Example 6-2 | Resist 6 | 47 nm | 3 |
| Example 6-3 | Resist 7 | 44 nm | 3 |
| Example 6-4 | Resist 8 | 44 nm | 4 |
| Comparative Example 6-1 | Comparative Resist 6 | 46 nm | 47 |
| Comparative Example 6-2 | Comparative Resist 7 | 50 nm | 68 |

It is evident from these results that the inventive resist compositions had good shelf stability since their resolution and defect control remained unchanged after 1 month of storage. An increase of watermark defects with time was found in Comparative Examples 6-1 and 6-2 using common tertiary amine compounds as component (A) or quencher. This is probably because the quencher participated in decomposition of the fluorinated polymer (E) during storage of the resist composition, resulting in a resist film losing water repellency on its surface.

The results of lithography tests A and B prove that the inventive resist compositions have a high resolution, improved defect control in the immersion lithography, and good shelf stability. The resist compositions are suited in micropatterning by photolithography.

Japanese Patent Application No. 2011-043556 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified resist composition comprising
(A) at least one tertiary amine compound having the general formula (1),
(B) at least one acid generator having the general formula (2),
(C) a base resin having an acidic functional group protected with an acid labile group, which is insoluble or substantially insoluble in alkaline developer and turns soluble in alkaline developer upon deprotection of the acid labile group, and
(D) an organic solvent,

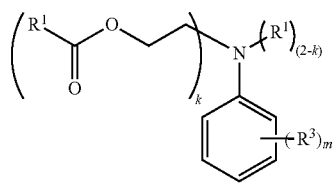

(1)

wherein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, k is 1 or 2, and m is an integer of 0 to 5,

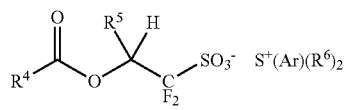

(2)

wherein $R^4$ is a $C_1$-$C_{30}$ alkyl, alkenyl or aralkyl group which may contain a heteroatom, or a backbone of the base resin (C), $R^5$ is hydrogen or trifluoromethyl, $R^6$ is Ar or a $C_1$-$C_{20}$ alkyl or alkenyl group which may contain a heteroatom, or two $R^6$ may bond together to form a $C_5$-$C_8$ ring with the sulfur atom to which they are attached, Ar is a substituted or unsubstituted $C_6$-$C_{20}$ aryl group which may contain a heteroatom.

2. The resist composition of claim 1, further comprising (E) a fluorinated polymer.

3. The resist composition of claim 2 wherein the fluorinated polymer (E) is a polymer containing at least 15% by weight of fluorine which is partially decomposed under the action of alkaline developer to become more hydrophilic.

4. The resist composition of claim 2 wherein component (E) comprises a polymer comprising at least 5% by weight of recurring units having the general formula (3) based on the entire recurring units,

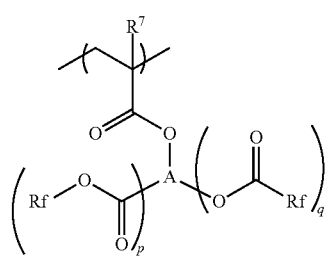

(3)

wherein $R^7$ is hydrogen or methyl, Rf is each independently a $C_1$-$C_{20}$ fluoroalkyl group, A is a $C_1$-$C_{30}$ organic group having a valence of (p+q+1), p and q are each independently an integer of 0 to 5, meeting p+q>0.

5. The resist composition of claim 1 wherein component (B) comprises at least one acid generator having the general formula (2a):

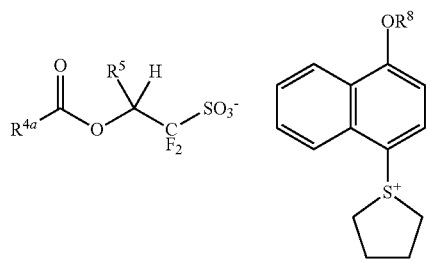

(2a)

wherein $R^{4a}$ is a $C_1$-$C_{30}$ alkyl, alkenyl or aralkyl group which may contain a heteroatom, $R^5$ is hydrogen or trifluoromethyl, and $R^8$ is hydrogen or a $C_1$-$C_{20}$ alkyl or alkenyl group which may contain a heteroatom.

6. The resist composition of claim 1 wherein component (A) comprises at least one tertiary amine compound having the general formula (1a):

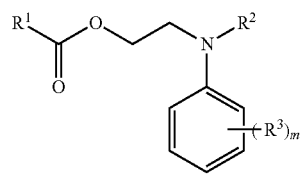

(1a)

wherein $R^1$ is a $C_1$-$C_{20}$ alkyl or alkenyl group or a substituted or unsubstituted $C_6$-$C_{20}$ aryl or aralkyl group, which may contain a heteroatom, $R^2$ is a $C_1$-$C_{10}$ alkyl group, $R^3$ is a $C_1$-$C_{10}$ alkyl or alkoxy group, and m is an integer of 0 to 5.

7. The resist composition of claim 1, further comprising (F) a surfactant.

8. A pattern forming process comprising the steps of:
(1) coating the chemically amplified resist composition of claim 1 onto a substrate and prebaking,
(2) exposing patternwise to high-energy radiation having a wavelength of up to 300 nm or EB, and
(3) baking and developing with a developer.

* * * * *